(12) United States Patent
Magill et al.

(10) Patent No.: US 6,855,422 B2
(45) Date of Patent: Feb. 15, 2005

(54) MULTI-COMPONENT FIBERS HAVING ENHANCED REVERSIBLE THERMAL PROPERTIES AND METHODS OF MANUFACTURING THEREOF

(76) Inventors: Monte C. Magill, 449 Westview Ct., Longmont, CO (US) 80501; Mark H. Hartmann, 256 Rockview Dr., Superior, CO (US) 80027; Jeffrey S. Haggard, 560 Amber La., Cocoa, FL (US) 32926

(*) Notice: Subject to any disclaimer, the term of this patent is extended or adjusted under 35 U.S.C. 154(b) by 15 days.

(21) Appl. No.: 10/052,232

(22) Filed: Jan. 15, 2002

(65) Prior Publication Data

US 2003/0035951 A1 Feb. 20, 2003

Related U.S. Application Data

(63) Continuation-in-part of application No. 09/691,164, filed on Oct. 19, 2000, now abandoned, and a continuation-in-part of application No. 09/960,591, filed on Sep. 21, 2001, now abandoned.
(60) Provisional application No. 60/234,410, filed on Sep. 21, 2000.

(51) Int. Cl.[7] .......................... D02G 3/00; B32B 15/02; B32B 12/02; B32B 19/00; D04H 5/00
(52) U.S. Cl. ............... 428/373; 428/402.2; 428/402.21; 428/402.22; 442/361
(58) Field of Search ................................. 428/373, 398, 428/402.2, 402.21, 402.22, 319.9, 321.1, 321.5; 442/361

(56) References Cited

U.S. PATENT DOCUMENTS

| | | |
|---|---|---|
| 4,003,426 A | 1/1977 | Best et al. |
| 4,111,189 A | 9/1978 | Dizon |
| 4,122,203 A | 10/1978 | Stahl |
| 4,169,554 A | 10/1979 | Camp |
| 4,178,727 A | 12/1979 | Prusinski et al. |
| 4,213,448 A | 7/1980 | Hebert |
| 4,219,072 A | 8/1980 | Barlow, Sr. |
| 4,237,023 A | 12/1980 | Johnson et al. |
| 4,258,696 A | 3/1981 | Gopal |

(List continued on next page.)

FOREIGN PATENT DOCUMENTS

| | | |
|---|---|---|
| EP | 0 306 202 A2 | 3/1989 |
| JP | 62-218200 | 3/1989 |
| JP | 03-059134 A | 3/1991 |

(List continued on next page.)

OTHER PUBLICATIONS

XP–002187982, JP 08 311716 (abstract) Database WPI, Section Ch, Week 199706.

Bryant, Melt Spun Fibers Containing Microencapsulated Phase Change Material, Advances in heat and Mass Transfer in Biotechnology (1999) HTD–vol. 363/BED–vol. 44, pp. 225–234.

Shimbun, Business Update, The Daily Yomiuri, 2003.

*Primary Examiner*—Terrel Morris
*Assistant Examiner*—Lynda M Salvatore
(74) *Attorney, Agent, or Firm*—Cooley Godward LLP

(57) ABSTRACT

The invention relates to a multi-component fiber having enhanced reversible thermal properties and methods of manufacturing thereof. The multi-component fiber comprises a fiber body formed from a plurality of elongated members, at least one of the elongated members comprising a temperature regulating material dispersed therein. The temperature regulating material comprises a phase change material. The multi-component fiber may be formed via a melt spinning process or a solution spinning process and may be used or incorporated in various products where a thermal regulating property is desired. For example, the multi-component fiber may be used in textiles, apparel, footwear, medical products, containers and packagings, buildings, appliances, and other products.

67 Claims, 4 Drawing Sheets

U.S. PATENT DOCUMENTS

| | | |
|---|---|---|
| 4,259,401 A | 3/1981 | Chahroudi et al. |
| 4,277,357 A | 7/1981 | Boardman |
| 4,290,416 A | 9/1981 | Maloney |
| 4,294,078 A | 10/1981 | MacCracken |
| 4,332,690 A | 6/1982 | Kimura et al. |
| 4,360,442 A | 11/1982 | Reedt et al. |
| 4,403,644 A | 9/1983 | Hebert |
| 4,403,645 A | 9/1983 | MacCracken |
| 4,460,649 A | 7/1984 | Park et al. |
| 4,462,390 A | 7/1984 | Holdridge et al. |
| 4,498,459 A | 2/1985 | Korin et al. |
| 4,504,402 A | 3/1985 | Chen et al. |
| 4,505,953 A | 3/1985 | Chen et al. |
| 4,513,053 A | 4/1985 | Chen et al. |
| 4,532,917 A | 8/1985 | Taff et al. |
| 4,572,864 A | 2/1986 | Benson et al. |
| 4,585,572 A | 4/1986 | Lane et al. |
| 4,587,279 A | 5/1986 | Salyer et al. |
| 4,587,404 A | 5/1986 | Smith |
| 4,615,381 A | 10/1986 | Maloney |
| 4,617,332 A | 10/1986 | Salyer et al. |
| 4,637,888 A | 1/1987 | Lane et al. |
| 4,690,769 A | 9/1987 | Lane et al. |
| 4,702,853 A | 10/1987 | Benson et al. |
| 4,708,812 A | 11/1987 | Hatfield |
| 4,711,813 A | 12/1987 | Salyer |
| 4,727,930 A | 3/1988 | Bruckner et al. |
| 4,746,479 A | 5/1988 | Hanaki et al. |
| 4,747,240 A | 5/1988 | Voisinet et al. |
| 4,756,958 A | 7/1988 | Bryant et al. |
| 4,807,696 A | 2/1989 | Colvin et al. |
| 4,825,939 A | 5/1989 | Salyer et al. |
| 4,828,542 A | 5/1989 | Hermann |
| 4,851,291 A | 7/1989 | Vigo et al. |
| 4,856,294 A | 8/1989 | Scaringe et al. |
| 4,871,615 A | 10/1989 | Vigo et al. |
| 4,908,166 A | 3/1990 | Salyer |
| 4,908,238 A | 3/1990 | Vigo et al. |
| 4,924,935 A | 5/1990 | Van Winckel |
| 4,964,402 A | 10/1990 | Grim et al. |
| 4,983,798 A | 1/1991 | Eckler et al. |
| 4,988,543 A | 1/1991 | Houle et al. |
| 5,007,478 A | 4/1991 | Sengupta |
| 5,008,133 A | 4/1991 | Herbet et al. |
| 5,053,446 A | 10/1991 | Salyer |
| 5,085,790 A | 2/1992 | Hormansdorfer |
| 5,106,520 A | 4/1992 | Salyer |
| 5,115,859 A | 5/1992 | Roebelen, Jr. et al. |
| 5,140,004 A | 8/1992 | Tanaka et al. |
| 5,153,066 A * | 10/1992 | Tanaka et al. ............... 428/373 |
| 5,162,074 A | 11/1992 | Hills |
| 5,202,150 A | 4/1993 | Benson et al. |
| 5,211,949 A | 5/1993 | Salyer |
| 5,220,954 A | 6/1993 | Longardner et al. |
| 5,254,380 A | 10/1993 | Salyer |
| 5,282,994 A | 2/1994 | Salyer |
| 5,290,904 A | 3/1994 | Colvin et al. |
| 5,366,801 A * | 11/1994 | Bryant et al. ............... 442/131 |
| 5,370,814 A | 12/1994 | Salyer |
| 5,381,670 A | 1/1995 | Tippmann et al. |
| 5,386,701 A | 2/1995 | Cao |
| RE34,880 E | 3/1995 | Salyer |
| 5,415,222 A | 5/1995 | Colvin et al. |
| 5,424,519 A | 6/1995 | Salee |
| 5,435,376 A | 7/1995 | Hart et al. |
| 5,477,917 A | 12/1995 | Salyer |
| 5,499,460 A | 3/1996 | Bryant et al. |
| 5,501,268 A | 3/1996 | Stovall et al. |
| 5,507,337 A | 4/1996 | Rafalovich et al. |
| 5,532,039 A | 7/1996 | Payne et al. |
| 5,552,075 A | 9/1996 | Salyer |
| 5,565,132 A | 10/1996 | Salyer |
| 5,626,936 A | 5/1997 | Alderman |
| 5,637,389 A | 6/1997 | Colvin et al. |
| 5,647,226 A | 7/1997 | Scaringe et al. |
| 5,669,584 A | 9/1997 | Hickey |
| 5,677,048 A | 10/1997 | Pushaw |
| 5,687,706 A | 11/1997 | Goswami et al. |
| 5,707,735 A | 1/1998 | Midkiff et al. |
| 5,709,914 A | 1/1998 | Hayes |
| 5,722,482 A | 3/1998 | Buckley |
| 5,750,962 A | 5/1998 | Hyatt |
| 5,755,216 A | 5/1998 | Salyer |
| 5,755,987 A | 5/1998 | Goldstein et al. |
| 5,755,988 A | 5/1998 | Lane et al. |
| 5,763,335 A | 6/1998 | Hermann |
| 5,765,389 A | 6/1998 | Salyer |
| 5,770,295 A | 6/1998 | Alderman |
| 5,785,884 A | 7/1998 | Hammond |
| 5,788,912 A | 8/1998 | Salyer |
| 5,804,297 A | 9/1998 | Colvin et al. |
| 5,851,338 A | 12/1998 | Pushaw |
| 5,851,562 A | 12/1998 | Haggard et al. |
| 5,855,999 A | 1/1999 | McCormack |
| 5,884,006 A | 3/1999 | Frohlich et al. |
| 5,885,475 A | 3/1999 | Salyer |
| 5,897,952 A | 4/1999 | Vigo et al. |
| 5,899,088 A | 5/1999 | Purdum |
| 5,911,923 A | 6/1999 | Work et al. |
| 5,932,129 A | 8/1999 | Hyatt |
| 5,935,157 A | 8/1999 | Harmon |
| 5,955,188 A | 9/1999 | Pushaw |
| 5,976,400 A | 11/1999 | Muffett et al. |
| 5,997,762 A | 12/1999 | Haget et al. |
| 5,999,699 A | 12/1999 | Hyatt |
| 6,004,662 A | 12/1999 | Buckley |
| 6,025,287 A | 2/2000 | Hermann |
| 6,041,437 A | 3/2000 | Barker et al. |
| 6,047,106 A | 4/2000 | Salyer |
| 6,048,810 A | 4/2000 | Baychar |
| 6,077,597 A | 6/2000 | Pause |
| 6,079,404 A | 6/2000 | Salyer |
| 6,099,555 A | 8/2000 | Sabin |
| 6,099,894 A | 8/2000 | Holman |
| 6,108,489 A | 8/2000 | Frohlich et al. |
| 6,109,338 A | 8/2000 | Butzer |
| 6,116,330 A | 9/2000 | Salyer |
| 6,119,573 A | 9/2000 | Berens et al. |
| 6,120,530 A | 9/2000 | Nuckols et al. |
| 6,125,645 A | 10/2000 | Horn |
| 6,136,217 A | 10/2000 | Haget et al. |
| 6,170,561 B1 | 1/2001 | O'Grady |
| 6,171,647 B1 | 1/2001 | Holman |
| 6,179,879 B1 | 1/2001 | Robinson et al. |
| 6,183,855 B1 | 2/2001 | Buckley |
| 6,185,742 B1 | 2/2001 | Doherty |
| 6,197,415 B1 | 3/2001 | Holman |
| 6,207,738 B1 | 3/2001 | Zuckerman et al. |
| 6,214,303 B1 | 4/2001 | Hoke et al. |
| 6,217,889 B1 | 4/2001 | Lorenzi et al. |
| 6,217,993 B1 | 4/2001 | Pause |
| 6,230,444 B1 | 5/2001 | Pause |
| 6,277,439 B1 | 8/2001 | Painter |
| 6,362,389 B1 | 3/2002 | McDowall et al. |
| 6,417,122 B1 | 7/2002 | Newkirk et al. |

FOREIGN PATENT DOCUMENTS

| | | |
|---|---|---|
| JP | 02-289916 | 6/1992 |
| JP | 08311716 | 11/1996 |
| JP | 11-200152 A | 7/1999 |

| | | |
|---|---|---|
| JP | 10-337362 | 6/2000 |
| JP | 2001-172866 | 6/2001 |
| JP | 2002-317329 | 10/2002 |
| JP | 2002-348780 | 12/2002 |
| TW | 422898 | 2/2001 |
| WO | WO 87/07854 | 12/1987 |
| WO | WO 93/15625 | 8/1993 |
| WO | WO 93/24241 | 12/1993 |
| WO | WO 95/29057 | 11/1995 |
| WO | WO 95/34609 | 12/1995 |
| WO | WO 97/43512 | 11/1997 |
| WO | WO 98/42929 | 10/1998 |
| WO | WO 98/45208 | 10/1998 |
| WO | WO 98/46669 | 10/1998 |
| WO | WO 99/25549 | 5/1999 |
| WO | WO 00/61360 | 10/2000 |
| WO | WO 00/65100 | 11/2000 |
| WO | WO 01/35511 | 5/2001 |
| WO | WO 01/38810 | 5/2001 |
| WO | WO 02/12607 | 2/2002 |
| WO | WO 02/24789 A2 | 3/2002 |
| WO | WO 02/24830 A2 | 3/2002 |
| WO | WO 02/24992 A1 | 3/2002 |

* cited by examiner

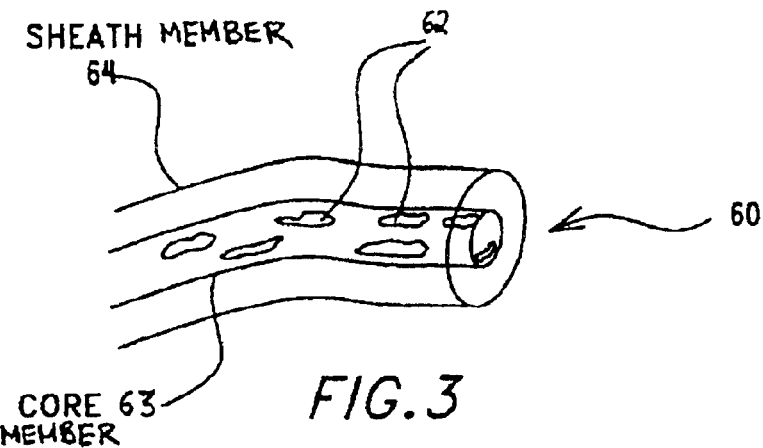

FIG. 3

MELT SPUN BICOMPONENT FIBERS WITH REVERSIBLE THERMAL PROPERTIES

|  | SAMPLE 1 | SAMPLE 2 | SAMPLE 3 | SAMPLE 4 | SAMPLE 5 | SAMPLE 6 |
|---|---|---|---|---|---|---|
| CORE POLYMER | 15% mPCM CONC. | 15% mPCM CONC. | 15% mPCM CONC. | 15% mPCM CONC. | 15% mPCM CONC. | 15% mPCM CONC. |
| SHEATH POLYMER | PP | PP | PP | NYLON 6 | NYLON 6 | NYLON 6 |
| CORE WT. % | 50 | 75 | 50 | 50 | 75 | 50 |
| SHEATH WT. % | 50 | 25 | 50 | 50 | 25 | 50 |
| WINDING SPEED | 1000 | 1000 | 2000 | 1100 | 1100 | 2000 |
| # FILAMENTS | 64 | 64 | 64 | 64 | 64 | 64 |
| SPIN DENIER | 1152 | 1152 | 400 | 1152 | 1152 | 400 |
| SPIN EASE | EXCELLENT | EXCELLENT | GOOD | EXCELLENT | EXCELLENT | GOOD |
| % mPCM | 7.5 | 11.25 | 7.5 | 7.5 | 11.25 | 7.5 |
| FIBER LATENT HEAT (J/G) | 11.5 | 17.1 | 10.5 | 9.4 | 15.5 | 10.3 |

FIG. 6

MULTI-COMPONENT FIBERS HAVING ENHANCED REVERSIBLE THERMAL PROPERTIES AND METHODS OF MANUFACTURING THEREOF

CROSS-REFERENCE TO RELATED APPLICATIONS

This application is a continuation-in-part of patents applications of Haggard, entitled "Temperature Adaptable Textile Fibers and Method of Preparing Same", U.S. Ser. No. 09/691,164, filed on Oct. 19, 2000 now abandoned, and Magill et al., entitled "Multi-component Fibers Having Enhanced Reversible Thermal Properties", U.S. Ser. No. 09/960,591, filed on Sep. 21, 2001 now abandoned, which claims the benefit of U.S. Provisional Application Serial No. 60/234,410, filed on Sep. 21, 2000, the disclosures of which are incorporated herein by reference in their entirety.

The present invention is related to the inventions disclosed in the copending patent applications of Hartmann, entitled "Stable Phase Change Materials For Use In Temperature Regulating Synthetic Fibers, Fabrics And Textiles", U.S. Ser. No. 09/960,901, filed on Sep. 21, 2001 now U.S. Pat. No. 6,689,466, and Hartmann et al., entitled "Melt Spinnable Concentrate Pellets Having Enhanced Reversible Thermal Properties", U.S. Ser. No. 09/777,512, filed Feb. 6, 2001 now U.S. Pat. No. 6,793,856, the disclosures of which are incorporated herein by reference in their entirety.

FIELD OF THE INVENTION

The present invention relates to synthetic fibers having enhanced reversible thermal properties. More particularly, the present invention relates to multi-component fibers comprising phase change materials and to the formation of such fibers via a melt spinning process or a solution spinning process.

BACKGROUND OF THE INVENTION

Many fabrics are made from synthetic fibers. Conventionally, two processes are used to manufacture synthetic fibers: a solution spinning process and a melt spinning process. The solution spinning process is generally used to form acrylic fibers, while the melt spinning process is generally used to form nylon fibers, polyester fibers, polypropylene fibers, and other similar type fibers. As is well known, a nylon fiber comprises a long-chain synthetic polyamide polymer characterized by the presence of an amide group—CONH—, a polyester fiber comprises a long-chain synthetic polymer having at least 85 percent by weight of an ester of a substituted aromatic carboxylic acid unit, and a polypropylene fiber comprises a long-chain synthetic crystalline polymer having at least 85 percent by weight of an olefin unit and typically having a number average molecular weight of about 40,000 or more.

The melt spinning process is of particular interest since a large portion of the synthetic fibers that are used in the textile industry are manufactured by this technique. The melt spinning process generally involves passing a molten polymeric material through a device that is known as a spinneret to thereby form a plurality of individual synthetic fibers. Once formed, the synthetic fibers may be collected into a strand or cut into staple fibers. Synthetic fibers can be used to make knitted, woven, or non-woven fabrics, or alternatively, synthetic fibers can be spun into a yarn to be used thereafter in a weaving or a knitting process to form a synthetic fabric.

Phase change materials have been incorporated into mono-component acrylic fibers to provide enhanced reversible thermal properties to the fibers themselves as well as to fabrics made therefrom. This is readily accomplished, in part due to the high levels of volatile materials (e.g., solvents) typically associated with the solution spinning process of forming acrylic fibers. However, it is more problematic to incorporate phase change materials into melt spun synthetic fibers, since high levels of volatile materials typically are not present or desired in the melt spinning process. Previous attempts to incorporate phase change materials into melt spun synthetic fibers typically involved mixing microcapsules containing a phase change material with a standard fiber-grade thermoplastic polymer to form a blend and subsequently melt spinning this blend to form mono-component synthetic fibers. Such attempts generally led to inadequate dispersion of the microcapsules within the fibers, poor fiber properties, and poor processability unless low concentrations of the microcapsules were used. However, with low concentrations of the microcapsules, the desired enhanced reversible thermal properties normally associated with use of phase change materials are difficult to realize.

It is against this background that a need arose to develop multi-component fibers comprising phase change materials.

SUMMARY OF THE INVENTION

In one innovative aspect, the present invention relates to a multi-component fiber having enhanced reversible thermal properties. In one exemplary embodiment, the multi-component fiber may comprise a fiber body formed from a plurality of elongated members, wherein at least one of the elongated members comprises a temperature regulating material dispersed therein.

In another exemplary embodiment, the multi-component fiber may comprise a first elongated member comprising a first polymeric material and a temperature regulating material dispersed within the first polymeric material. The multi-component fiber also may comprise a second elongated member comprising a second polymeric material, wherein the second elongated member is joined with the first elongated member.

In still another exemplary embodiment, the multi-component fiber may comprise a core member that comprises a temperature regulating material. The multi-component fiber may further comprise a sheath member that surrounds the core member.

In a second innovative aspect, the present invention relates to a fiber having enhanced reversible thermal properties. In one exemplary embodiment, the fiber may comprise at least one inner member extending through substantially the length of the fiber and comprising a blend of a first polymeric material and a temperature regulating material. An outer member may surround the inner member and form the exterior of the fiber, wherein the outer member comprises a second polymeric material.

In a third innovative aspect, the present invention relates to a core/sheath fiber. In one exemplary embodiment, the core/sheath fiber may comprise a core member positioned within and extending through substantially the length of the fiber, wherein the core member comprises a blend of a first polymeric material and a temperature regulating material. The core/sheath fiber may further comprise a sheath member forming the exterior of the fiber and surrounding the core member, wherein the sheath member comprises a second polymeric material.

In a fourth innovative aspect, the present invention relates to an island-in-sea fiber. In one exemplary embodiment, the island-in-sea fiber may comprise a plurality of island members positioned within and extending through substantially the length of the fiber, wherein each of the island members is separated from one another and comprises a blend of an island polymeric material and a temperature regulating material. The island-in-sea fiber may further comprise a sea member forming the exterior of the fiber and surrounding each of the island members, wherein the sea member comprises a sea polymeric material.

In a fifth innovative aspect, the present invention relates to a method of manufacturing and processing a fiber having enhanced reversible thermal properties. In one exemplary embodiment, the method may comprise mixing a temperature regulating material with a first polymeric material so as to form a blend and combining the blend with a second polymeric material in a spin pack of a fiber extrusion apparatus such that the second polymeric material surrounds the blend. The method may further comprise extruding the blend and the second polymeric material from a spinneret of the spin pack so as to form a fiber having an outer member formed of the second polymeric material and surrounding an inner member formed of the blend.

In a sixth innovative aspect, the present invention relates to a method of manufacturing a fiber having enhanced reversible thermal properties. In one exemplary embodiment, the method may comprise forming a plurality of separate blends, wherein each blend comprises a temperature regulating material and a first polymeric material, and combining the plurality of separate blends with a second polymeric material in a spin pack of a fiber extrusion apparatus such that the second polymeric material surrounds the plurality of separate blends. The method may further comprise extruding the plurality of separate blends and the second polymeric material from a spinneret of the spin pack so as to form a fiber having an outer member formed of the second polymeric material and surrounding a plurality of inner members formed of the plurality of separate blends.

In a seventh innovative aspect, the present invention relates to a fabric. In one exemplary embodiment, the fabric may comprise a plurality of fibers blended together, wherein at least one fiber exhibits enhanced reversible thermal properties. The fiber may comprise at least one inner member comprising a blend of a first polymeric material and a temperature regulating material, wherein the inner member extends through substantially the length of the fiber. The fiber may further comprise an outer member forming the exterior of the fiber and surrounding the inner member, wherein the outer member comprises a second polymeric material.

In another exemplary embodiment, the fabric may comprise a plurality of fibers blended together, wherein at least one fiber exhibits enhanced reversible thermal properties. The fiber may comprise a fiber body formed from a plurality of elongated members, wherein at least one of the elongated members comprises a temperature regulating material dispersed therein.

BRIEF DESCRIPTION OF THE DRAWINGS

For a better understanding of the nature and objects of the invention, reference should be made to the following detailed description taken in conjunction with the accompanying drawings.

FIG. 3 illustrates a three-dimensional view of another exemplary core/sheath fiber according to an embodiment of the invention.

FIG. 6 shows a number of properties and manufacturing parameters of six core/sheath fibers that were produced as discussed in Example 1.

DETAILED DESCRIPTION

Figure 1:
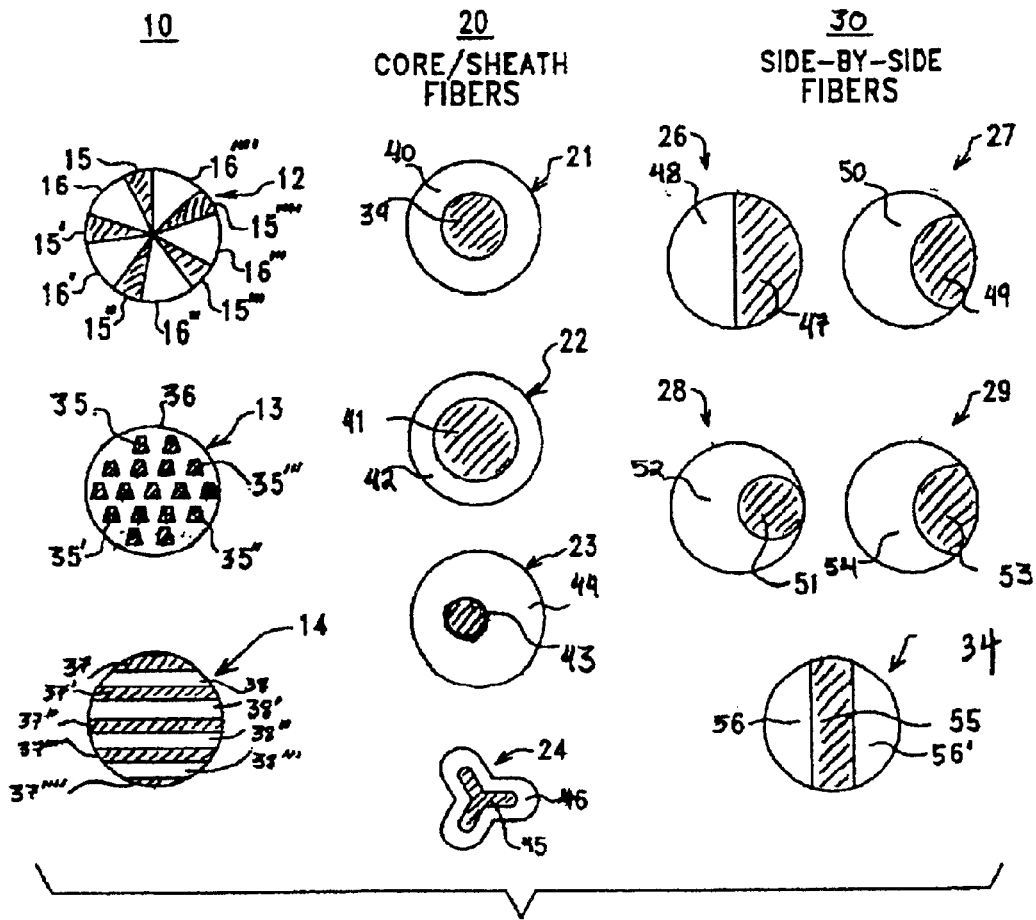
FIG. 1 illustrates enlarged cross sectional views of various exemplary multi-component fibers according to some embodiments of the invention.

The present invention relates to multi-component fibers comprising one or more phase change materials and methods of manufacturing thereof. Multi-component fibers in accordance with various embodiments of the invention have the ability to absorb or release thermal energy to reduce or eliminate heat flow. In addition, such multi-component fibers may exhibit improved processability (e.g., during manufacturing of the fibers or of a product made therefrom), improved strength, improved containment of a phase change material within the fibers, or higher loading levels of the phase change material. The multi-component fibers may be used or incorporated in various products to provide a thermal regulating property while providing improved strength to the products. For example, multi-component fibers in accordance with embodiments of the invention may be used in textiles (e.g., fabrics), apparel (e.g., outdoor clothing, drysuits, and protective suits), footwear (e.g., socks, boots, and insoles), medical products (e.g., thermal blankets, therapeutic pads, incontinent pads, and hot/cold packs), containers and packagings (e.g., beverage/food containers, food warmers, seat cushions, and circuit board laminates), buildings (e.g., insulation in walls or ceilings, wallpaper, curtain linings, pipe wraps, carpets, and tiles), appliances (e.g., insulation in house appliances), and other products (e.g., automotive lining material, sleeping bags, and bedding).

In conjunction with the thermal regulating property provided, multi-component fibers in accordance with various embodiments of the present invention when incorporated, for example, in apparel or footwear may provide a reduction in an individual's skin moisture, such as, due to perspiration. For instance, the multi-component fibers may lower the temperature or the relative humidity of the skin, thereby providing a lower degree of skin moisture and a higher level of comfort. The use of specific materials and specific apparel or footwear design features may further enhance this moisture reduction result.

A multi-component fiber according to some embodiments of the invention may comprise a plurality of elongated members. According to some embodiments of the invention, the multi-component fiber may comprise a fiber body formed from the plurality of elongated members. The fiber body typically will be elongated and may have a length that is several times (e.g., 100 times or more) greater than its diameter. The fiber body may have a variety of regular or irregular cross sectional shapes such as, by way of example and not by limitation, circular, multi-lobal, octagonal, oval, pentagonal, rectangular, square-shaped, trapezoidal, triangular, wedge-shaped, and so forth. According to some embodiments of the invention, two or more of the elongated members (e.g., two adjacent elongated members) may be joined, combined, united, or bonded to form a unitary fiber body.

According to some embodiments of the invention, at least one of the elongated members will comprise a temperature regulating material. Typically, the temperature regulating material will comprise one or more phase change materials to provide the multi-component fiber with enhanced reversible thermal properties. In some embodiments of the invention, the elongated members may comprise the same or different polymeric materials, and at least one of the elongated members may have the temperature regulating material dispersed therein. Typically, the temperature regulating material will be uniformly dispersed within at least one of the elongated members. However, depending upon the particular characteristics desired from the multi-component fiber, the dispersion of the temperature regulating material may be varied within one or more of the elongated members. According to some embodiments of the invention, two or more elongated members may comprise the same or different temperature regulating materials.

Depending upon the particular application of the multi-component fiber, the elongated members may be arranged in one of a variety of configurations. For instance, the elongated members may be arranged in an island-in-sea configuration or a core-sheath configuration. The elongated members may be arranged in other configurations such as, by way of example and not by limitation, a matrix or checkerboard configuration, a segmented-pie configuration, a side-by-side configuration, a striped configuration, and so forth. According to some embodiments of the invention, the elongated members may be arranged in a bundle form wherein the elongated members are generally parallel with respect to one another. According to other embodiments of the invention, one or more elongated members may extend through at least a portion of the length of the fiber body, and, if desired, the elongated members may be longitudinally coextensive. For example, according to some embodiments of the invention, at least one inner member may extend through substantially the length of the multi-component fiber and comprise a temperature regulating material. The extent to which the inner member extends through the length of the multi-component fiber may depend on, for example, desired thermal regulating properties for the multi-component fiber. In addition, other factors (e.g., desired mechanical properties or method of forming the multi-component fiber) may play a role in determining this extent. Thus, in one embodiment, the inner member may extend through from about a half up to the entire length of the multi-component fiber to provide desired thermal regulating properties. An outer member may surround the inner member and form the exterior of the multi-component fiber.

According to some embodiments of the invention, the multi-component fiber may be between about 0.1 to about 1000 denier or between about 0.1 to about 100 denier. Typically, the multi-component fiber according to an embodiment of the invention may be between about 0.5 to about 10 denier. As one of ordinary skill in the art will understand, a denier is typically understood to be a measure of weight per unit length of a fiber (i.e., grams per 9000 meters).

If desired, the multi-component fiber according to some embodiments of the invention may be further processed to form one or more smaller denier fibers. For instance, the elongated members comprising the multi-component fiber may be split apart to form two or more smaller denier fibers, wherein each smaller denier fiber may comprise one or more of the elongated members. Alternatively or in conjunction, one or more elongated members (or a portion or portions thereof) comprising the multi-component fiber may be dissolved or melted away to yield one or more smaller denier fibers. Typically, at least one resulting smaller denier fiber will comprise a temperature regulating material to provide desired thermal regulating properties.

Depending upon the method of manufacturing the multi-component fiber, desirability of further processing, or particular application of the multi-component fiber, the multi-component fiber may further comprise one or more additives, such as, by way of example and not by limitation, water, surfactants, dispersants, anti-foam agents (e.g., silicone containing compounds and fluorine containing compounds), antioxidants (e.g., hindered phenols and phosphites), thermal stabilizers (e.g., phosphites, organophosphorous compounds, metal salts of organic carboxylic acids, and phenolic compounds), light or UV stabilizers (e.g., hydroxy benzoates, hindered hydroxy benzoates, and hindered amines), microwave absorbing additives (e.g., multifunctional primary alcohols, glycerine, and carbon), reinforcing fibers (e.g., carbon fibers, aramid fibers, and glass fibers), conductive fibers or particles (e.g., graphite or activated carbon fibers or particles), lubricants, process aids (e.g., metal salts of fatty acids, fatty acid esters, fatty acid ethers, fatty acid amides, sulfonamides, polysiloxanes, organophosphorous compounds, silicon containing compounds, fluorine containing compounds, and phenolic polyethers), fire retardants (e.g., halogenated compounds, phosphorous compounds, organophosphates, organobromides, alumina trihydrate, melamine derivatives, magnesium hydroxide, antimony compounds, antimony oxide, and boron compounds), anti-blocking additives (e.g., silica, talc, zeolites, metal carbonates, and organic polymers), anti-fogging additives (e.g., non-ionic surfactants, glycerol esters, polyglycerol esters, sorbitan esters and their ethoxylates, nonyl phenyl ethoxylates, and alcohol ethyoxylates), anti-static additives (e.g., non-ionics such as fatty acid esters, ethoxylated alkylamines, diethanolamides, and ethoxylated alcohol; anionics such as alkylsulfonates and alkylphosphates; cationics such as metal salts of chlorides, methosulfates or nitrates, and quaternary ammonium compounds; and amphoterics such as alkylbetaines), anti-microbials (e.g., arsenic compounds, sulfur, copper compounds, isothiazolins phthalamides, carbamates, silver base inorganic agents, silver zinc zeolites, silver copper zeolites, silver zeolites, metal oxides, and silicates), crosslinkers or controlled degradation agents (e.g., peroxides, azo compounds, and silanes), colorants, pigments, dyes, fluorescent whitening agents or optical brighteners (e.g., bis-benzoxazoles, phenylcoumarins, and bis-(styryl)biphenyls), fillers (e.g., natural minerals and metals such as oxides, hydroxides, carbonates, sulfates, and silicates; talc; clay; wollastonite; graphite; carbon black; carbon fibers; glass fibers and beads; ceramic fibers and beads; metal fibers and beads; flours; and fibers of natural or synthetic origin such as fibers of wood, starch, or cellulose flours), coupling agents (e.g., silanes, titanates, zirconates, fatty acid salts, anhydrides, epoxies, and unsaturated polymeric acids), reinforcement agents, crystallization or nucleation agents (e.g., any material which increases or improves the crystallinity in a polymer, such as to improve rate/ kinetics of crystal growth, number of crystals grown, or type of crystals grown), and so forth. The one or more additives may be dispersed within one or more of the elongated members comprising the multi-component fiber.

According to some embodiments of the invention, certain treatments or coatings may be applied to the multi-component fiber to impart additional properties such as, by way of example and not by limitation, stain resistance, water repellency, softer feel, and moisture management properties. Exemplary treatments and coatings include Epic by Nextec Applications Inc., Intera by Intera Technologies, Inc., Zonyl Fabric Protectors by DuPont Inc., Scotchgard by 3M Co., and so forth.

With reference to FIG. 1, enlarged cross sectional views of various exemplary multi-component fibers 12, 13, 14, 21, 22, 23, 24, 26, 27, 28, 29, and 34 according to some embodiments of the invention are illustrated. More particularly, FIG. 1 illustrates a variety of exemplary configurations of arranging elongated members comprising the multi-component fibers, according to some embodiments of the invention.

As shown in FIG. 1, each multi-component fiber (e.g., 21) comprises a plurality of distinct cross sectional regions corresponding to a plurality of elongated members (e.g., 39 and 40) that form the multi-component fiber. According to the presently illustrated embodiments, the elongated members include a first elongated member (or a first plurality of elongated members) (shown shaded in FIG. 1) and a second elongated member (or a second plurality of elongated members) (shown unshaded in FIG. 1). Here, the first elongated member (or the first plurality of elongated members) preferably may be formed from a polymeric material that has a temperature regulating material dispersed therein. The second elongated member (or the second plurality of elongated members) may be formed from the same polymeric material or another polymeric material having somewhat different properties. It should be recognized that the number, shapes, and sizes of the elongated members shown in FIG. 1 are illustrated by way of example and not by limitation, and various other embodiments are within the scope of the invention.

While FIG. 1 illustrates multi-component fibers with circular or tri-lobal cross sectional shapes, multi-component fibers with a variety of other regular or irregular cross sectional shapes are encompassed by the invention, such as, by way of example and not by limitation, multi-lobal, octagonal, oval, pentagonal, rectangular, square-shaped, trapezoidal, triangular, wedge-shaped, and so forth. It should be recognized that, in general, a first plurality of elongated members may be formed from the same or different polymeric materials, and a second plurality of elongated members may be formed from the same or different polymeric materials. Moreover, a temperature regulating material may be dispersed within a second elongated member (or a second plurality of elongated members), according to some embodiments of the invention. It should be further recognized that two or more different temperature regulating materials may be dispersed within the same or different elongated members. For instance, a first temperature regulating material may be dispersed within a first elongated member, and a second temperature regulating material having somewhat different properties may be dispersed within a second elongated member (e.g., two different phase change materials).

According to some embodiments of the invention, one or more elongated members may be formed from a temperature regulating material that need not be dispersed within a polymeric material. For instance, the temperature regulating material may comprise a polymer (or mixture of polymers) that provides enhanced reversible thermal properties and that may be used to form a first elongated member (or a first plurality of elongated members). For such embodiments of the invention, it may be desirable, but not required, that a second elongated member (or a second plurality of elongated members) adequately surrounds the first elongated member (or the first plurality of elongated members) to reduce or prevent loss or leakage of the temperature regulating material. In addition, it should be recognized that, in general, two or more elongated members may be formed from the same or different temperature regulating materials.

With reference to FIG. 1, left-hand column 10 illustrates three exemplary multi-component fibers 12, 13, and 14. Multi-component fiber 12 comprises a plurality of elongated members arranged in a segmented-pie configuration. In the present embodiment, a first plurality of elongated members 15, 15', 15", 15''', and 15'''' and a second plurality of elongated members 16, 16', 16", 16''', and 16'''' are arranged in an alternating fashion and have cross sectional areas that are wedge-shaped. In general, the elongated members may have the same or different cross sectional shapes or sizes. Moreover, while multi-component fiber 12 is shown comprising ten elongated members, it should be recognized that, in general, two or more elongated members may be arranged in a segmented-pie configuration, and at least one of the elongated members typically will comprise a temperature regulating material.

Multi-component fiber 13 comprises a plurality of elongated members arranged in an island-in-sea configuration. In the present embodiment, a first plurality of elongated members 35, 35' 35", 35''', etc. extends through substantially the length of the multi-component fiber 13 and are separated from each other. The first plurality of elongated members 35, 35' 35", 35''', etc. is shown positioned within and completely surrounded by a second elongated member 36, thereby forming "islands" within the "sea" of the second elongated member 36. The arrangement of these "islands" within the "sea" may serve to provide a more uniform distribution of a temperature regulating material within multi-component fiber 13. In the present embodiment, each of the first plurality of elongated members 35, 35' 35", 35''', etc. has a cross sectional shape that is trapezoidal. It should be recognized, however, that a variety of other regular or irregular cross sectional shapes are encompassed by the invention, such as, by way of example and not by limitation, circular, multi-lobal, octagonal, oval, pentagonal, rectangular, square-shaped, triangular, wedge-shaped, and so forth. In general, the first plurality of elongated members 35, 35', 35", 35''', etc. may have the same or different cross sectional shapes or sizes. Moreover, while multi-component fiber 13 is shown with seventeen elongated members 35, 35', 35", 35''', etc. positioned within and surrounded by the second elongated member 36, it should be recognized that, in general, one or more elongated members may be positioned within and surrounded by the second elongated member 36.

Multi-component fiber 14 comprises a plurality of elongated members arranged in a striped configuration. In the present embodiment, a first plurality of elongated members 37, 37', 37", 37''', and 37'''' and a second plurality of elongated members 38, 38', 38", and 38''' are arranged in an alternating fashion and are shaped as longitudinal slices of the multi-component fiber 14. In general, the elongated members may have the same or different cross sectional shapes or sizes (e.g., widths associated with the longitudinal slices). If desired, multi-component fiber 14 may be a self-crimping or self-texturing fiber, wherein the fiber's crimping or texturing imparts loft, bulk, insulation, stretch, or other like properties to the fiber. While multi-component fiber 14 is shown comprising nine elongated members, it should be recognized that, in general, two or more elongated members may be arranged in a striped configuration, and at least one of the elongated members typically will comprise a temperature regulating material.

In the case of multi-component fibers 12 and 14, a first elongated member (e.g., 15) is shown partially surrounded by an adjacent second elongated member or members (e.g., 16 and 16""), whereas, in the case of multi-component fiber 13, a first elongated member (e.g., 35) is shown completely surrounded by a unitary second elongated member 36. When a first elongated member (e.g., 15) is not completely surrounded, it may be desirable, but not required, that a containment structure (e.g., microcapsules) be used to contain a phase change material dispersed within the first elongated member. If desired, multi-component fibers 12, 13, and 14 may be further processed to form one or more smaller denier fibers. Thus, for example, the elongated members comprising multi-component fiber 12 may be split apart, or one or more of the elongated members (or a portion or portions thereof) may be dissolved or melted away. A resulting smaller denier fiber may, for example, comprise the elongated members 15 and 16 that may be joined to one another.

Middle column 20 of FIG. 1 illustrates four exemplary core/sheath fibers 21, 22, 23, and 24. In particular, core/sheath fibers 21, 22, 23, and 24 each comprises a plurality of elongated members arranged in a core-sheath configuration.

Core/sheath fiber 21 comprises a first elongated member 39 positioned within and surrounded by a second elongated member 40. More particularly, the first elongated member 39 is formed as a core member that comprises a temperature regulating material. This core member is shown concentrically positioned within and completely surrounded by the second elongated member 40 that is formed as a sheath member. Here, core/sheath fiber 21 comprises 25 percent by weight of the core member and 75 percent by weight of the sheath member.

Core/sheath fiber 22 comprises a first elongated member 41 positioned within and surrounded by a second elongated member 42. As with the previously discussed embodiment, the first elongated member 41 is formed as a core member that comprises a temperature regulating material and is concentrically positioned within and completely surrounded by the second elongated member 42 that is formed as a sheath member. Here, core/sheath fiber 22 comprises 50 percent by weight of the core member and 50 percent by weight of the sheath member.

Core/sheath fiber 23 comprises a first elongated member 43 positioned within and surrounded by a second elongated member 44. In the present embodiment, however, the first elongated member 43 is formed as a core member that is eccentrically positioned within the second elongated member 44 that is formed as a sheath member. Core/sheath fiber 23 may comprise virtually any percentages by weight of the core member and the sheath member to provide desired thermal regulating and mechanical properties.

Tri-lobal core/sheath fiber 24 comprises a first elongated member 45 positioned within and surrounded by a second elongated member 46. In the present embodiment, the first elongated member 45 is formed as a core member that has a tri-lobal cross sectional shape. This core member is concentrically positioned within the second elongated member 46 that is formed as a sheath member. Core/sheath fiber 23 may comprise virtually any percentages by weight of the core member and the sheath member to provide desired thermal regulating and mechanical properties.

It should be recognized that a core member may, in general, have a variety of regular or irregular cross sectional shapes, such as, by way of example and not by limitation, circular, multi-lobal, octagonal, oval, pentagonal, rectangular, square-shaped, trapezoidal, triangular, wedge-shaped, and so forth. While core/sheath fibers 21, 22, 23, and 24 are shown with one core member positioned within and surrounded by a sheath member, it should be recognized that two or more core members may be positioned within and surrounded by a sheath member (e.g., in a manner similar to that shown for multi-component fiber 13). These two or more core members may have the same or different cross sectional shapes or sizes. According to some embodiments of the invention, a core/sheath fiber comprises three or more elongated members arranged in a core-sheath configuration, wherein the elongated members are shaped as concentric or eccentric longitudinal slices of the core/sheath fiber.

Right-hand column 30 of FIG. 1 illustrates a number of exemplary side-by-side fibers in accordance with some embodiments of the invention. In particular, side-by-side fibers 26, 27, 28, 29, and 34 each comprises a plurality of elongated members arranged in a side-by-side configuration.

Side-by-side fiber 26 comprises a first elongated member 47 positioned adjacent and partially surrounded by a second elongated member 48. In the present embodiment, the elongated members 47 and 48 have half-circular cross sectional shapes. Here, side-by-side fiber 26 comprises 50 percent by weight of the first elongated member 47 and 50 percent by weight of the second elongated member 48. It should be recognized that the elongated members 47 and 48 may, alternatively or in conjunction, be characterized as being arranged in a segmented-pie or a striped configuration.

Side-by-side fiber 27 comprises a first elongated member 49 positioned adjacent and partially surrounded by a second elongated member 50. In the present embodiment, side-by-side fiber 27 comprises 20 percent by weight of the first elongated member 49 and 80 percent by weight of the second elongated member 50. It should be recognized that the elongated members 49 and 50 may, alternatively or in conjunction, be characterized as being arranged in a core-sheath configuration, wherein the first elongated member 49 is eccentrically positioned with respect to and partially surrounded by the second elongated member 50.

Side-by-side fibers 28 and 29 are two exemplary mixed-viscosity fibers. Each fiber comprises a first elongated member 51 or 53 having a temperature regulating material dispersed therein that is positioned adjacent and partially surrounded by a second elongated member 52 or 54. A mixed viscosity-fiber is typically considered to be a self-crimping or self-texturing fiber, wherein the fiber's crimping or texturing imparts loft, bulk, insulation, stretch, or other like properties to the fiber. Typically, a mixed-viscosity fiber comprises a plurality of elongated members that are formed from different polymeric materials. For example, for side-by-side fiber 28, the first elongated member 51 may be formed from a first polymeric material, and the second elongated member 52 may be formed from a second polymeric material that may differ in some fashion from the first polymeric material. In the present embodiment, the first and second polymeric materials may comprise polymers with different viscosities or molecular weights (e.g., two polypropylenes with different molecular weights or a polypropylene and a polyethylene, respectively). When side-by-side fiber 28 is drawn, uneven stresses may be created between the two elongated members 51 and 52, and side-by-side fiber 28 may crimp or bend. According to other embodiments of the invention, the first and second polymeric materials may comprise polymers having different degrees of crystallinity. For instance, the first polymeric material may have a lower degree of crystallinity than the second polymeric material.

When side-by-side fiber 28 is drawn, the first and second polymeric materials may undergo different degrees of crystallization and orientation to "lock" an orientation and strength into the fiber 28. A sufficient degree of crystallization may be desired to prevent or reduce reorientation of the fiber 28 during heat treatment. Side-by-side fibers 28 and 29 may comprise virtually any percentages by weight of the first and second elongated members to provide desired thermal regulating, mechanical, and self-crimping or self-texturing properties.

Side-by-side fiber 34 is an exemplary ABA fiber comprising a first elongated member 55 positioned between and partially surrounded by a second plurality of elongated members 56 and 56'. In the present embodiment, the first elongated member 55 is formed from a first polymeric material that has a temperature regulating material dispersed therein. Here, the second plurality of elongated members 56 and 56' may be formed from the first polymeric material or from a second polymeric material that may differ in some fashion from the first polymeric material. In general, the elongated members 56 and 56' may have the same or different cross sectional shapes or sizes (e.g., widths associated with the longitudinal slices). It should be recognized that the elongated members 55, 56, and 56' may, alternatively or in conjunction, be characterized as being arranged in a striped configuration.

Figure 2:
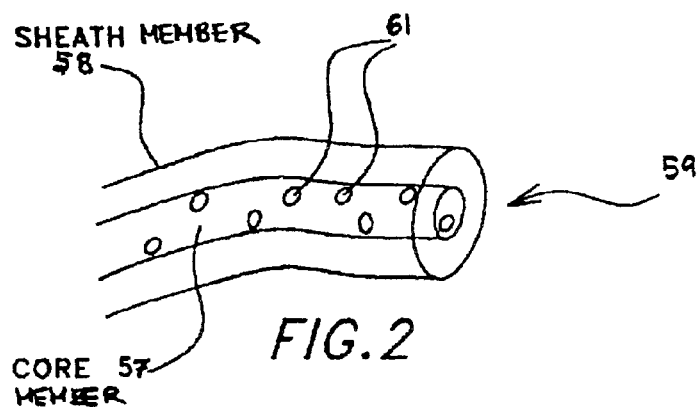
FIG. 2 illustrates a three-dimensional view of an exemplary core/sheath fiber according to an embodiment of the invention.

Turning next to FIG. 2, a three-dimensional view of an exemplary core/sheath fiber 59 is illustrated. Core/sheath fiber 59 comprises an elongated and generally cylindrical core member 57 positioned within and surrounded by an elongated and annular-shaped sheath member 58. In the present embodiment, the core member 57 extends through substantially the length of the core/sheath fiber 59. The core member 57 has a temperature regulating material 61 dispersed therein and is positioned within and completely surrounded or encased by the sheath member 58 that forms the exterior of the core/sheath fiber 59. In the present embodiment, the temperature regulating material 61 comprises a plurality of microcapsules containing a phase change material, and the microcapsules may be uniformly dispersed throughout the core member 57. Those of ordinary skill in the art will appreciate that, while it may be preferred to have the microcapsules evenly dispersed within the core member 57, this is not necessary in all applications. The core member 57 may be concentrically or eccentrically positioned within the sheath member 58, and core/sheath fiber 59 may comprise virtually any percentages by weight of the core member 57 and the sheath member 58 to provide desired thermal regulating and mechanical properties.

With reference to FIG. 3, a three-dimensional view of another exemplary core/sheath fiber 60 is illustrated. As with core/sheath fiber 59, core/sheath fiber 60 comprises an elongated and generally cylindrical core member 63 extending through substantially the length of the core/sheath fiber 60. The core member 63 is positioned within and completely surrounded or encased by an elongated and annular-shaped sheath member 64 that forms the exterior of the core/sheath fiber 60. Here, a temperature regulating material 62 comprises a phase change material in a raw form (e.g., the phase change material is non-encapsulated, i.e., not micro- or macroencapsulated), and the phase change material may be uniformly dispersed throughout the core member 63. Those of ordinary skill in the art will appreciate that, while it may be preferred to have the phase change material evenly dispersed within the core member 63, this is not necessary in all applications. In the present embodiment shown in FIG. 3, the phase change material forms distinct domains that are dispersed within the core member 63. By surrounding the core member 63, the sheath member 64 may serve to enclose the phase change material within the core member 63. Accordingly, the sheath member 64 may reduce or prevent loss or leakage of the phase change material during fiber processing or during end use. The core member 63 may be concentrically or eccentrically positioned within the sheath member 64, and core/sheath fiber 60 may comprise virtually any percentages by weight of the core member 63 and the sheath member 64 to provide desired thermal regulating and mechanical properties.

Figure 4:
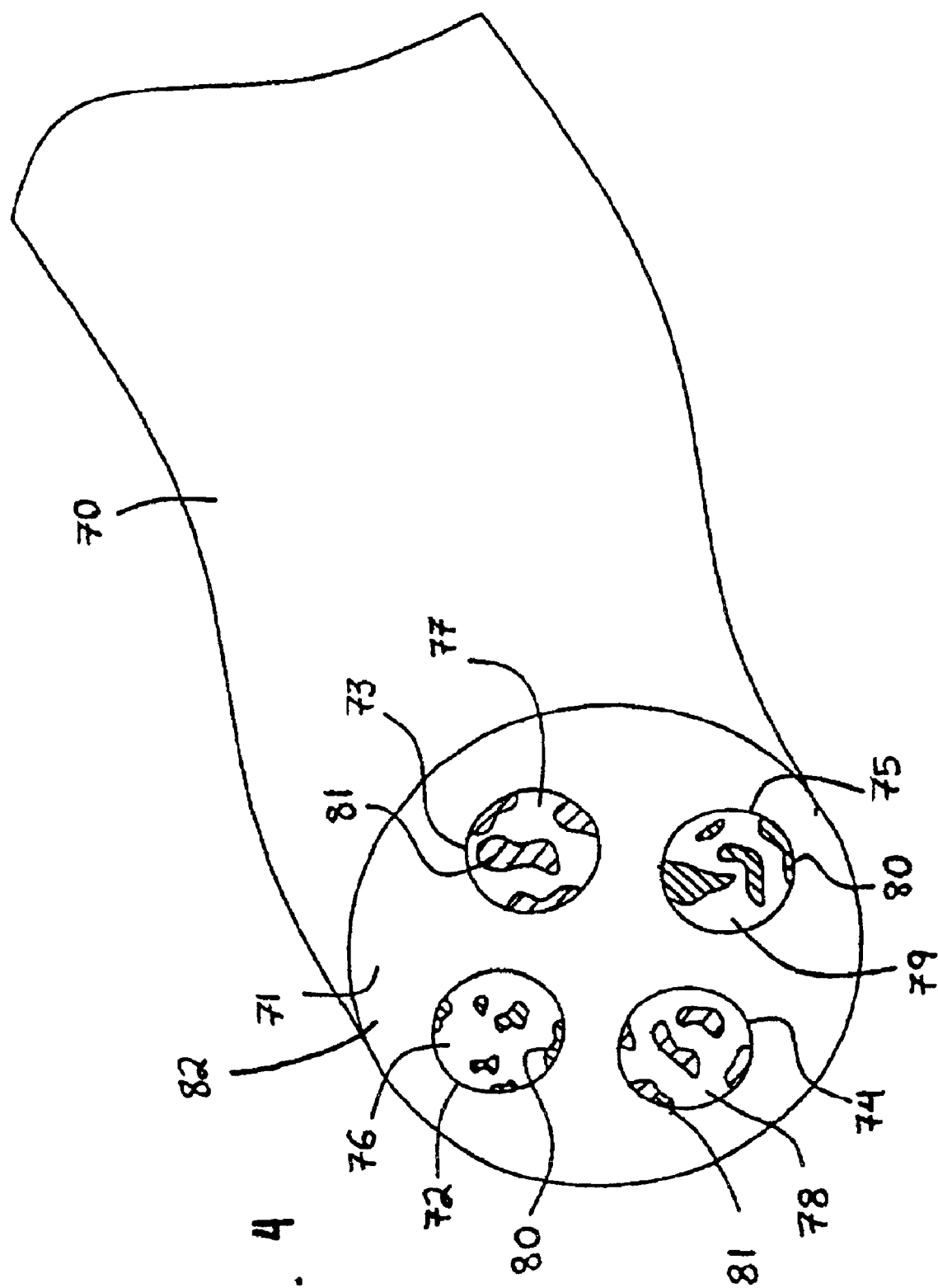
FIG. 4 illustrates a three-dimensional view of an exemplary island-in-sea fiber according to an embodiment of the invention.

With reference to FIG. 4, a three-dimensional view of an exemplary island-in-sea fiber 70 is illustrated. Island-in-sea fiber 70 comprises a plurality of elongated and generally cylindrical island members 72, 73, 74, and 75 positioned within and completely surrounded or encased by an elongated sea member 71. In the present embodiment, the island members 72, 73, 74, and 75 extend though substantially the length of the island-in-sea fiber 70. While four island members are shown in the present embodiment, it should be recognized that island-in-sea fiber 70 may comprise more or less islands members depending on the specific application of the island-in-sea fiber 70. The sea member 71 is formed of a sea polymeric material 82, and the island members 72, 73, 74, and 75 are formed of island polymeric materials 76, 77, 78, and 79, respectively. The sea polymeric material 82 and the island polymeric materials 76, 77, 78, and 79 may be the same or may differ from one another in some fashion. One or more temperature regulating materials may be dispersed within the island members 72, 73, 74, and 75. As shown in FIG. 4, island-in-sea fiber 70 comprises two different temperature regulating materials 80 and 81. Island members 72 and 75 comprise the temperature regulating material 80, while island members 73 and 74 comprise the temperature regulating material 81. Here, the temperature regulating materials 80 and 81 may each comprise a phase change material in a raw form that forms distinct domains within respective island members. By surrounding the island members 72, 73, 74, and 75, the sea member 71 may serve to enclose the phase change materials within island-in-sea fiber 70. Island-in-sea fiber 70 may comprise virtually any percentages by weight of the island members 72, 73, 74, and 75 and the sea member 71 to provide desired thermal regulating and mechanical properties.

As discussed previously, a multi-component fiber according to some embodiments of the invention may comprise one or more temperature regulating materials. A temperature regulating material typically will comprise one or more phase change materials. In general, a phase change material may comprise any substance (or mixture of substances) that has the capability of absorbing or releasing thermal energy to reduce or eliminate heat flow at or within a temperature stabilizing range. The temperature stabilizing range may comprise a particular transition temperature or range of transition temperatures. A phase change material used in conjunction with various embodiments of the invention preferably will be capable of inhibiting a flow of thermal energy during a time when the phase change material is absorbing or releasing heat, typically as the phase change material undergoes a transition between two states (e.g., liquid and solid states, liquid and gaseous states, solid and gaseous states, or two solid states). This action is typically transient, e.g., will occur until a latent heat of the phase change material is absorbed or released during a heating or cooling process. Thermal energy may be stored or removed from the phase change material, and the phase change material typically can be effectively recharged by a source of heat or cold. By selecting an appropriate phase change material, the multi-component fiber may be designed for use in any one of numerous products.

According to some embodiments of the invention, a phase change material may be a solid/solid phase change material. A solid/solid phase change material is a type of phase change material that typically undergoes a transition between two solid states (e.g., a crystalline or mesocrystalline phase transformation) and hence typically does not become a liquid during use.

Phase change materials that can be incorporated in multi-component fibers in accordance with various embodiments of the invention include a variety of organic and inorganic substances. Exemplary phase change materials include, by way of example and not by limitation, hydrocarbons (e.g., straight chain alkanes or paraffinic hydrocarbons, branched-chain alkanes, unsaturated hydrocarbons, halogenated hydrocarbons, and alicyclic hydrocarbons), hydrated salts (e.g., calcium chloride hexahydrate, calcium bromide hexahydrate, magnesium nitrate hexahydrate, lithium nitrate trihydrate, potassium fluoride tetrahydrate, ammonium alum, magnesium chloride hexahydrate, sodium carbonate decahydrate, disodium phosphate dodecahydrate, sodium sulfate decahydrate, and sodium acetate trihydrate), waxes, oils, water, fatty acids, fatty acid esters, dibasic acids, dibasic esters, 1-halides, primary alcohols, aromatic compounds, clathrates, semi-clathrates, gas clathrates, anhydrides (e.g., stearic anhydride), ethylene carbonate, polyhydric alcohols (e.g., 2,2-dimethyl-1,3-propanediol, 2-hydroxymethyl-2-methyl-1,3-propanediol, ethylene glycol, polyethylene glycol, pentaerythritol, dipentaerythritol, pentaglycerine, tetramethylol ethane, neopentyl glycol, tetramethylol propane, 2-amino-2-methyl-1,3-propanediol, monoaminopentaerythritol, diaminopentaerythritol, and tris(hydroxymethyl)acetic acid), polymers (e.g., polyethylene, polyethylene glycol, polyethylene oxide, polypropylene, polypropylene glycol, polytetramethylene glycol, polypropylene malonate, polyneopentyl glycol sebacate, polypentane glutarate, polyvinyl myristate, polyvinyl stearate, polyvinyl laurate, polyhexadecyl methacrylate, polyoctadecyl methacrylate, polyesters produced by polycondensation of glycols (or their derivatives) with diacids (or their derivatives), and copolymers, such as polyacrylate or poly(meth)acrylate with alkyl hydrocarbon side chain or with polyethylene glycol side chain and copolymers comprising polyethylene, polyethylene glycol, polyethylene oxide, polypropylene, polypropylene glycol, or polytetramethylene glycol), metals, and mixtures thereof.

The selection of a phase change material will typically be dependent upon a desired transition temperature or a desired application of a resulting multi-component fiber. For example, a phase change material having a transition temperature near room temperature may be desirable for applications in which the resulting multi-component fiber is incorporated into apparel designed to maintain a comfortable temperature for a user.

A phase change material according to some embodiments of the invention may have a transition temperature ranging from about −5° to about 125° C. In one presently preferred embodiment useful for clothing applications, the phase change material will have a transition temperature ranging from about 22° to about 40° C. or from about 22° to about 28° C.

According to some embodiments of the invention, particularly useful phase change materials include paraffinic hydrocarbons having between 10 to 44 carbon atoms (i.e., $C_{10}$–$C_{44}$ paraffinic hydrocarbons). Table 1 provides a list of exemplary $C_{13}$–$C_{28}$ paraffinic hydrocarbons that may be used as the phase change material in the multi-component fibers described herein. The number of carbon atoms of a paraffinic hydrocarbon typically correlates with its melting point. For example, n-Octacosane, which contains twenty-eight straight chain carbon atoms per molecule, has a melting point of 61.4° C. By comparison, n-Tridecane, which contains thirteen straight chain carbon atoms per molecule, has a melting point of −5.5° C. According to an embodiment of the invention, n-Octadecane, which contains eighteen straight chain carbon atoms per molecule and has a melting point of 28.2° C., is particularly desirable for clothing applications.

TABLE 1

| Paraffinic Hydrocarbon | No. of Carbon Atoms | Melting Point (° C.) |
|---|---|---|
| n-Octacosane | 28 | 61.4 |
| n-Heptacosane | 27 | 59.0 |
| n-Hexacosane | 26 | 56.4 |
| n-Pentacosane | 25 | 53.7 |
| n-Tetracosane | 24 | 50.9 |
| n-Tricosane | 23 | 47.6 |
| n-Docosane | 22 | 44.4 |
| n-Heneicosane | 21 | 40.5 |
| n-Eicosane | 20 | 36.8 |
| n-Nonadecane | 19 | 32.1 |
| n-Octadecane | 18 | 28.2 |
| n-Heptadecane | 17 | 22.0 |
| n-Hexadecane | 16 | 18.2 |
| n-Pentadecane | 15 | 10.0 |
| n-Tetradecane | 14 | 5.9 |
| n-Tridecane | 13 | −5.5 |

Other useful phase change materials include polymeric phase change materials having transition temperatures suitable for a desired application of the multi-component fiber (e.g., from about 22° to about 40° C. for clothing applications). A polymeric phase change material may comprise a polymer (or mixture of polymers) having a variety of chain structures that include one or more types of monomer units. In particular, polymeric phase change materials may include linear polymers, branched polymers (e.g., star branched polymers, comb branched polymers, or dendritic branched polymers), or mixtures thereof. A polymeric phase change material may comprise a homopolymer, a copolymer (e.g., terpolymer, statistical copolymer, random copolymer, alternating copolymer, periodic copolymer, block copolymer, radial copolymer, or graft copolymer), or a mixture thereof. As one of ordinary skill in the art will understand, the reactivity and functionality of a polymer may be altered by addition of a functional group such as, for example, amine, amide, carboxyl, hydroxyl, ester, ether, epoxide, anhydride, isocyanate, silane, ketone, and aldehyde. Also, a polymer comprising a polymeric phase change material may be capable of crosslinking, entanglement, or hydrogen bonding in order to increase its toughness or its resistance to heat, moisture, or chemicals.

According to some embodiments of the invention, a polymeric phase change material may be desirable as a result of having a higher molecular weight, larger molecular size, or higher viscosity relative to non-polymeric phase change materials (e.g., paraffinic hydrocarbons). As a result of this larger molecular size or higher viscosity, a polymeric phase change material may exhibit a lesser tendency to leak from the multi-component fiber during processing or during end use. When incorporated within a core/sheath fiber or island-in-sea fiber, for example, this larger molecular size or higher viscosity may prevent the polymeric phase change material from flowing through a sheath member or sea member forming the exterior of the fiber. In addition to providing thermal regulating properties, a polymeric phase change material may provide improved mechanical properties (e.g., ductility, tensile strength, and hardness) when incorporated in multi-component fibers in accordance with various embodiments of the invention. If desired, a polymeric phase change material having a desired transition temperature may be combined with a polymeric material to form an elongated member. According to some embodiments of the invention, the polymeric phase change material may provide adequate mechanical properties such that it may be used to form the elongated member without requiring the polymeric material, thus allowing for a higher loading level of the polymeric phase change material and improved thermal regulating properties.

For example, polyethylene glycols may be used as the phase change material in some embodiments of the invention. The number average molecular weight of a polyethylene glycol typically correlates with its melting point. For instance, a polyethylene glycol having a number average molecular weight range of 570 to 630 (e.g., Carbowax 600) will have a melting point of 20° to 25° C., making it desirable for clothing applications. Other polyethylene glycols that may be useful at other temperature stabilizing ranges include Carbowax 400 (melting point of 4° to 8° C.), Carbowax 1500 (melting point of 44° to 48° C.), and Carbowax 6000 (melting point of 56° to 63° C.). Polyethylene oxides having a melting point in the range of 60° to 65° C. may also be used as phase change materials in some embodiments of the invention. Further desirable phase change materials include polyesters having a melting point in the range of 0° to 40° C. that may be formed, for example, by polycondensation of glycols (or their derivatives) with diacids (or their derivatives). Table 2 sets forth melting points of exemplary polyesters that may be formed with various combinations of glycols and diacids.

TABLE 2

| Glycol | Diacid | Melting Point of Polyester (° C.) |
| --- | --- | --- |
| Ethylene glycol | Carbonic | 39 |
| Ethylene glycol | Pimelic | 25 |
| Ethylene glycol | Diglycolic | 17–20 |
| Ethylene glycol | Thiodivaleric | 25–28 |
| 1,2-Propylene glycol | Diglycolic | 17 |
| Propylene glycol | Malonic | 33 |
| Propylene glycol | Glutaric | 35–39 |
| Propylene glycol | Diglycolic | 29–32 |
| Propylene glycol | Pimelic | 37 |
| 1,3-butanediol | Sulphenyl divaleric | 32 |
| 1,3-butanediol | Diphenic | 36 |
| 1,3-butanediol | Diphenyl methane-m,m'-diacid | 38 |
| 1,3-butanediol | trans-H,H-terephthalic acid | 18 |
| Butanediol | Glutaric | 36–38 |
| Butanediol | Pimelic | 38–41 |
| Butanediol | Azelaic | 37–39 |
| Butanediol | Thiodivaleric | 37 |
| Butanediol | Phthalic | 17 |
| Butanediol | Diphenic | 34 |
| Neopentyl glycol | Adipic | 37 |
| Neopentyl glycol | Suberic | 17 |
| Neopentyl glycol | Sebacic | 26 |
| Pentanediol | Succinic | 32 |
| Pentanediol | Glutaric | 22 |

TABLE 2-continued

| Glycol | Diacid | Melting Point of Polyester (° C.) |
| --- | --- | --- |
| Pentanediol | Adipic | 36 |
| Pentanediol | Pimelic | 39 |
| Pentanediol | para-phenyl diacetic acid | 33 |
| Pentanediol | Diglycolic | 33 |
| Hexanediol | Glutaric | 28–34 |
| Hexanediol | 4-Octenedioate | 20 |
| Heptanediol | Oxalic | 31 |
| Octanediol | 4-Octenedioate | 39 |
| Nonanediol | meta-phenylene diglycolic | 35 |
| Decanediol | Malonic | 29–34 |
| Decanediol | Isophthalic | 34–36 |
| Decanediol | meso-tartaric | 33 |
| Diethylene glycol | Oxalic | 10 |
| Diethylene glycol | Suberic | 28–35 |
| Diethylene glycol | Sebacic | 36–44 |
| Diethylene glycol | Phthalic | 11 |
| Diethylene glycol | trans-H,H-terephthalic acid | 25 |
| Triethylene glycol | Sebacic | 28 |
| Triethylene glycol | Sulphonyl divaleric | 24 |
| Triethylene glycol | Phthalic | 10 |
| Triethylene glycol | Diphenic | 38 |
| para-dihydroxy-methyl benzene | Malonic | 36 |
| meta-dihydroxy-methyl benzene | Sebacic | 27 |
| meta-dihydroxy-methyl benzene | Diglycolic | 35 |

According to some embodiments of the invention, a polymeric phase change material having a desired transition temperature may be formed by reacting a phase change material (e.g., an exemplary phase change material discussed above) with a polymer (or mixture of polymers). Thus, for example, n-octadecylic acid (i.e., stearic acid) may be reacted or esterified with polyvinyl alcohol to yield polyvinyl stearate, or dodecanoic acid (i.e., lauric acid) may be reacted or esterified with polyvinyl alcohol to yield polyvinyl laurate. Various combinations of phase change materials (e.g., phase change materials with one or more functional groups such as amine, carboxyl, hydroxyl, epoxy, silane, sulfuric, and so forth) and polymers may be reacted to yield polymeric phase change materials having desired transition temperatures.

A phase change material can comprise a mixture of two or more substances (e.g., two or more of the exemplary phase change materials discussed above). By selecting two or more different substances (e.g., two different paraffinic hydrocarbons) and forming a mixture thereof, a temperature stabilizing range can be adjusted over a wide range for any particular application of the multi-component fiber. According to some embodiments of invention, the mixture of two or more different substances may exhibit two or more distinct transition temperatures or a single modified transition temperature when incorporated in the multi-component fiber.

According to some embodiments of the invention, the temperature regulating material may comprise a phase change material in a raw form (e.g., the phase change material is non-encapsulated, i.e., not micro- or macroencapsulated). During manufacture of the multi-component fiber, the phase change material in the raw form may be provided as a solid in a variety of forms (e.g., bulk form, powders, pellets, granules, flakes, and so forth) or as a liquid in a variety of forms (e.g., molten form, dissolved in a solvent, and so forth).

According to other embodiments of the invention, the temperature regulating material may further comprise a containment structure that encapsulates, contains, surrounds, absorbs, or reacts with a phase change material. This containment structure may facilitate handling of the phase change material while offering a degree of protection to the phase change material during manufacture of the multi-component fiber or a product made therefrom (e.g., protection from high temperatures or shear forces). Moreover, the containment structure may serve to reduce or prevent leakage of the phase change material from the multi-component fiber during use. According to some embodiments of the invention, use of the containment structure may be desirable, but not required, wherein a first elongated member having the phase change material dispersed therein is not completely surrounded by a second elongated member.

For instance, the temperature regulating material may comprise a plurality of microcapsules that contain a phase change material, and the microcapsules may be uniformly, or non-uniformly, dispersed within at least one of the elongated members. The microcapsules may be formed as shells enclosing the phase change material and may comprise individual microcapsules formed in a variety regular or irregular shapes (e.g., spherical, ellipsoidal, and so forth) and sizes. The individual microcapsules may have the same or different shapes or sizes. According to some embodiments of the invention, the microcapsules may have a maximum linear dimension (e.g., diameter) ranging from about 0.01 to about 100 microns. In one presently preferred embodiment, the microcapsules will have a generally spherical shape and will have a maximum linear dimension (e.g., diameter) ranging from about 0.5 to about 3 microns. Other examples of the containment structure may include, by way of example and not by limitation, silica particles (e.g., precipitated silica particles, fumed silica particles, and mixtures thereof), zeolite particles, carbon particles (e.g., graphite particles, activated carbon particles, and mixtures thereof), and absorbent materials (e.g., absorbent polymeric materials, superabsorbent materials, cellulosic materials, poly(meth)acrylate materials, metal salts of poly(meth)acrylate materials, and mixtures thereof). For instance, the temperature regulating material may comprise silica particles, zeolite particles, carbon particles, or an absorbent material impregnated with a phase change material.

According to some embodiments of the invention, one or more elongated members may each comprise up to about 100 percent by weight of the temperature regulating material. Typically, an elongated member may comprise up to about 90 percent by weight of the temperature regulating material (e.g., up to about 50 percent or up to about 25 percent by weight of the temperature regulating material). In some presently preferred embodiments, an elongated member may comprise from about 5 percent to about 70 percent by weight of the temperature regulating material. Thus, in one embodiment, an elongated member may comprise 60 percent by weight of the temperature regulating material, and in other embodiments, the elongated member may comprise from about 10 percent to about 30 percent or from about 15 percent to about 25 percent by weight of the temperature regulating material.

As discussed previously, a multi-component fiber according to some embodiments of the invention may comprise a plurality of elongated members. These elongated members may be formed from the same or different polymeric materials. According to some embodiments of the invention, the elongated members may include a first elongated member (or a first plurality of elongated members) formed from a first polymeric material that has a temperature regulating material dispersed therein. In addition, the elongated members may include a second elongated member (or a second plurality of elongated members) formed from a second polymeric material that may differ in some fashion from the first polymeric material. It should be recognized that the elongated members may be formed from the same polymeric material, in which case the first and second polymeric materials will be the same. According to some embodiments of the invention, the temperature regulating material may comprise a polymeric phase change material that provides adequate mechanical properties such that it may be used to form the first elongated member (or the first plurality of elongated members) without requiring the first polymeric material.

In general, a polymeric material (e.g., the first polymeric material or the second polymeric material) may comprise any polymer (or mixture of polymers) that has the capability of being formed into an elongated member. According to some embodiments of the invention, an elongated member may be formed from any fiber-forming polymer (or mixture of fiber-forming polymers). According to embodiments of the invention wherein a melt spinning process is used to form the multi-component fiber, a polymeric material may comprise a thermoplastic polymer (or mixture of thermoplastic polymers) (i.e., one that can be heated to form a melt and subsequently shaped or molded to form an elongated member). According to other embodiments of the invention, a polymeric material may comprise an elastomeric polymer (or mixture of elastomeric polymers).

A polymeric material may comprise a polymer (or mixture of polymers) having a variety of chain structures that include one or more types of monomer units. In particular, a polymeric material may comprise a linear polymer, a branched polymer (e.g., star branched polymer, comb branched polymer, or dendritic branched polymer), or a mixture thereof. A polymeric material may comprise a homopolymer, a copolymer (e.g., terpolymer, statistical copolymer, random copolymer, alternating copolymer, periodic copolymer, block copolymer, radial copolymer, or graft copolymer), or a mixture thereof. As one of ordinary skill in the art will understand, the reactivity and functionality of a polymer may be altered by addition of a functional group such as, for example, amine, amide, carboxyl, hydroxyl, ester, ether, epoxide, anhydride, isocyanate, silane, ketone, and aldehyde. Also, a polymer comprising a polymeric material may be capable of crosslinking, entanglement, or hydrogen bonding in order to increase its toughness or its resistance to heat, moisture, or chemicals.

Exemplary polymers that may be used to form an elongated member according to various embodiments of the invention include, by way of example and not by limitation, polyamides (e.g., Nylon 6, Nylon 6/6, Nylon 12, polyaspartic acid, polyglutamic acid, and so forth), polyamines, polyimides, polyacrylics (e.g., polyacrylamide, polyacrylonitrile, esters of methacrylic acid and acrylic acid, and so forth), polycarbonates (e.g., polybisphenol A carbonate, polypropylene carbonate, and so forth), polydienes (e.g., polybutadiene, polyisoprene, polynorbornene, and so forth), polyepoxides, polyesters (e.g., polyethylene terephthalate, polybutylene terephthalate, polytrimethylene terephthalate, polycaprolactone, polyglycolide, polylactide, polyhydroxybutyrate, polyhydroxyvalerate, polyethylene adipate, polybutylene adipate, polypropylene succinate, and so forth), polyethers (e.g., polyethylene glycol (polyethylene oxide), polybutylene glycol, polypropylene oxide, polyoxymethylene (paraformaldehyde), polytetramethylene ether (polytetrahydrofuran), polyepichlorohydrin, and so forth), polyfluorocarbons, formaldehyde polymers (e.g., urea-formaldehyde, melamine-formaldehyde, phenol formaldehyde, and so forth), natural polymers (e.g., cellulosics, chitosans, lignins, waxes, and so forth), polyolefins (e.g., polyethylene, polypropylene, polybutylene, polybutene, polyoctene, and so forth), polyphenylenes (e.g., polyphenylene oxide, polyphenylene sulfide, polyphenylene ether sulfone, and so forth), silicon containing polymers (e.g., polydimethyl siloxane, polycarbomethyl silane, and so forth), polyurethanes, polyvinyls (e.g., polyvinyl butyral, polyvinyl alcohol, esters and ethers of polyvinyl alcohol, polyvinyl acetate, polystyrene, polymethylstyrene, polyvinyl chloride, polyvinyl pyrrolidone, polymethyl vinyl ether, polyethyl vinyl ether, polyvinyl methyl ketone, and so forth), polyacetals, polyarylates, and copolymers (e.g., polyethylene-co-vinyl acetate, polyethylene-co-acrylic acid, polybutylene terephthalate-co-polyethylene terephthalate, polylauryllactam-block-polytetrahydrofuran, and so forth).

According to some embodiments of the invention, the first polymeric material may comprise a polymer (or mixture of polymers) that facilitates dispersing or incorporating the temperature regulating material within the first elongated member (or the first plurality of elongated members). According to some embodiments of the invention, the first polymeric material may comprise a polymer (or mixture of polymers) that is compatible or miscible with or has an affinity for the temperature regulating material. In some embodiments of the invention, this affinity may depend on, by way of example and not by limitation, similarity of solubility parameters, polarities, hydrophobic characteristics, or hydrophilic characteristics of the first polymeric material and the temperature regulating material. Such affinity may facilitate dispersion of the temperature regulating material in an intermediate molten or liquid form of the first polymeric material during manufacture of the multi-component fiber and, thus, ultimately may facilitate incorporation of more uniform or greater amounts or loading level of a phase change material in the multi-component fiber. In embodiments where the temperature regulating material further comprises a containment structure, the first polymeric material may comprise a polymer (or mixture of polymers) selected for its affinity for the containment structure in conjunction with or as an alternative to its affinity for the phase change material. For instance, if the temperature regulating material comprises a plurality of microcapsules containing the phase change material, a polymer (or mixture of polymers) may be selected having an affinity for the microcapsules (e.g., for a material or materials of which the microcapsules are formed). For instance, some embodiments of the invention may select the first polymeric material to comprise the same or a similar polymer as a polymer comprising the microcapsules (e.g., if the microcapsules comprise nylon shells, the first polymeric material may be selected to comprise nylon). Such affinity may facilitate dispersion of the microcapsules containing the phase change material in an intermediate molten or liquid form of the first polymeric material and, thus, ultimately facilitates incorporation of more uniform or greater amounts or loading level of the phase change material in the multi-component fiber. In one presently preferred embodiment of the invention, the first polymeric material may be selected to be sufficiently non-reactive with the temperature regulating material so that a desired temperature stabilizing range is maintained when the temperature regulating material is dispersed within the first polymeric material.

According to some embodiments of the invention, the first polymeric material may comprise a polymer (or mixture of polymers) that has a slight or partial compatibility or miscibility with or affinity for the temperature regulating material (e.g., a semi-miscible polymer). Such partial affinity may be adequate to facilitate dispersion of the temperature regulating material and to facilitate processing at higher temperatures and during a melt spinning process. At lower temperatures and shear conditions and once the multi-component fiber has been formed, this partial affinity may allow the temperature regulating material to separate out. For embodiments of the invention wherein a phase change material in a raw form is used, this partial affinity may lead to insolubilization of the phase change material and increased phase change material domain formation within the multi-component fiber. According to some embodiments of the invention, domain formation may lead to an improved thermal regulating property by facilitating transition of the phase change material between two states. In addition, domain formation may serve to reduce or prevent loss or leakage of the phase change material from the multi-component fiber during processing or during use.

For instance, certain phase change materials such as paraffinic hydrocarbons may be compatible with polymeric materials comprising polyethylene or polyethylene-co-vinyl-acetate at lower concentrations of the phase change materials or when the temperature is above a critical solution temperature. Mixing of a paraffinic hydrocarbon (or a mixture of paraffinic hydrocarbons) and polyethylene or polyethylene-co-vinyl acetate may be achieved at higher temperatures and higher concentrations of the paraffinic hydrocarbon to produce a homogenous blend that may be easily controlled, pumped, and processed in a melt spinning process. Once a multi-component fiber has been formed and has cooled, the paraffinic hydrocarbon may become insoluble and may separate out into distinct domains. These domains may allow for pure melting or crystallization of the paraffinic hydrocarbon for an improved thermal regulating property. In addition, these domains may serve to reduce or prevent loss or leakage of the paraffinic hydrocarbon. According to some embodiments of the invention, the first polymeric material may comprise polyethylene-co-vinyl acetate having between about 5 and about 90 percent by weight of the vinyl acetate, and, according to other embodiments of the invention, the vinyl acetate content is between about 5 and about 50 percent by weight. In one presently preferred embodiment, the vinyl acetate content is desirably between 18 to 25 percent by weight. This content of the vinyl acetate may allow for temperature miscibility control when mixing the paraffinic hydrocarbon and the polyethylene-co-vinyl acetate to form a blend. In particular, this vinyl acetate content may allow for excellent miscibility at higher temperatures, thus facilitating melt spinning process stability and control due to homogeneity of the blend. At lower temperatures (e.g., room temperature or normal commercial fabric use temperatures), the polyethylene-co-vinyl acetate is semi-miscible with the paraffinic hydrocarbon, thus allowing for separation and micro-domain formation of the paraffinic hydrocarbon.

The first polymeric material may serve as a carrier for the temperature regulating material as the multi-component fiber is being formed in accordance with some embodiments of the invention. In addition, the first polymeric material may facilitate maintaining integrity of the first elongated member (or the first plurality of elongated members) during fiber processing and provide enhanced mechanical properties to the resulting multi-component fiber.

According to an embodiment of the invention, the first polymeric material may comprise a low molecular weight polymer (or a mixture of low molecular weight polymers). A low molecular weight polymer typically has a low viscosity when heated to form a melt, which low viscosity may facilitate dispersion of the temperature regulating material in the melt. As one of ordinary skill in the art will understand, some polymers may be provided in a variety of forms having different molecular weights, since the molecular weight of a polymer may be determined by conditions used for manufacturing the polymer. Accordingly, as used herein, the term "low molecular weight polymer" may refer to a low molecular weight form of a polymer (e.g., a low molecular weight form of an exemplary polymer discussed previously), and the term "molecular weight" may refer to a number average molecular weight, weight average molecular weight, or melt index of the polymer. For instance, a polyethylene having a number average molecular weight of about 20,000 (or less) may be used as the low molecular weight polymer in an embodiment of the invention. It should be recognized that a molecular weight or range of molecular weights associated with a low molecular weight polymer may depend on the particular polymer selected (e.g., polyethylene) or on the method or equipment used to disperse the temperature regulating material in a melt of the low molecular weight polymer.

According to another embodiment of the invention, the first polymeric material may comprise a mixture of a low molecular weight polymer and a high molecular weight polymer. A high molecular weight polymer typically has enhanced physical properties (e.g., mechanical properties) but may have a high viscosity when heated to form a melt. As used herein, the term "high molecular weight polymer" may refer to a high molecular weight form of a polymer (e.g., a high molecular weight form of an exemplary polymer discussed previously). A low molecular weight polymer or a high molecular weight polymer may be selected to be compatible or miscible with or to have an affinity for one another. Such affinity may facilitate forming a mixture of the low molecular weight polymer, the high molecular weight polymer, and the temperature regulating material during manufacture of the multi-component fiber and, thus, ultimately facilitates incorporation of more uniform or greater amounts or loading level of the phase change material in the multi-component fiber. According to some embodiments of the invention, the low molecular weight polymer serves as a compatibilizing link between the high molecular weight polymer and the temperature regulating material to thereby facilitate incorporating the temperature regulating material in the multi-component fiber.

According to some embodiments of the invention, an elongated member may typically comprise from about 10 percent to about 30 percent by weight of the temperature regulating material with the remaining portion of the elongated member comprising a low molecular weight polymer and a high molecular weight polymer. For example, in one presently preferred embodiment, the elongated member may comprise 15 percent by weight of the low molecular weight polymer, 70 percent by weight of the high molecular weight polymer, and 15 percent by weight of the temperature regulating material.

According to some embodiments of the invention, the second polymeric material may comprise a polymer (or mixture of polymers) that has or provides one or more desired physical properties for the multi-component fiber. Exemplary desired physical properties include, by way of example and not by limitation, mechanical properties (e.g., ductility, tensile strength, and hardness), thermal properties (e.g., thermoformability), and chemical properties (e.g., reactivity). The second polymeric material may comprise a polymer (or mixture of polymers) selected to compensate for any deficiencies (e.g., mechanical or thermal deficiencies) of the first polymeric material or of the first elongated member (or the first plurality of elongated members), such as due to a high loading level of the temperature regulating material. According to some embodiments of the invention, the second polymeric material operates to improve the multi-component fiber's overall physical properties (e.g., mechanical properties) and the multi-component fiber's processability (e.g., by facilitating its formation via a melt spinning process). The second polymeric material may serve to enclose the temperature regulating material that comprises the first elongated member (or the first plurality of elongated members). Accordingly, the second polymeric material may allow for the use of a first polymeric material or of a temperature regulating material that is not optimized for high temperature and high shear fiber processing. In addition, the second polymeric material may reduce or prevent loss or leakage of a phase change material during fiber processing or during end use. According to some embodiments of the invention, the second polymeric material may be sufficiently non-reactive with the temperature regulating material to maintain a desired temperature stabilizing range of the temperature regulating material.

According to an embodiment of the invention, the second polymeric material may comprise a high molecular weight polymer. As discussed previously, a high molecular weight polymer typically has enhanced physical properties (e.g., mechanical properties) and may be selected to be a high molecular weight form of a polymer (e.g., a high molecular weight form of an exemplary polymer discussed previously).

According to some presently preferred embodiments of the invention, the second polymeric material may comprise a polyester due, in part, to its excellent processability, properties imparted to a resulting fiber, and its resistance to certain phase change materials such as paraffinic hydrocarbons to reduce or prevent loss or leakage of these phase change materials. According to an embodiment of the invention, the polyester may have a number average molecular weight of about 20,000 (or more).

At this point, those of ordinary skill in the art can appreciate a number of advantages associated with various embodiments of the invention. For instance, a multi-component fiber in accordance with various embodiments of the invention can comprise high loading levels of one or more phase change materials within a first elongated member (or a first plurality of elongated members). According to some embodiments of the invention, a high loading level can be provided because a second elongated member (or a second plurality of elongated members) surrounds the first elongated member (or the first plurality of elongated members). The second elongated member may comprise a polymer (or mixture of polymers) selected to compensate for any deficiencies (e.g., mechanical or thermal deficiencies) associated with the first elongated member, such as due to the high loading level of the phase change material. Moreover, the second elongated member may comprise a polymer (or mixture of polymers) selected to improve the fiber's overall physical properties (e.g., mechanical properties) and the fiber's processability (e.g., by facilitating its formation via a melt spinning process). By surrounding the first elongated member, the second elongated member may serve to enclose the phase change material within the multi-component fiber to reduce or prevent loss or leakage of the phase change material.

Multi-component fibers in accordance with various embodiments of the invention can have virtually any proportion of the fiber's total weight comprising a first elongated member (or a first plurality of elongated members) that includes a temperature regulating material relative to a second elongated member (or a second plurality of elongated members). By way of example and not by limitation, when a thermal regulating property of a multi-component fiber is a controlling consideration, a larger proportion of the multi-component fiber may comprise a first elongated member that includes a temperature regulating material. On the other hand, when the physical properties of the multi-component fiber (e.g., mechanical properties) are a controlling consideration, a larger proportion of the multi-component fiber may comprise a second elongated member that does not include the temperature regulating material. Alternatively, when balancing thermal regulating and physical properties of the multi-component fiber, it may be desirable that the second elongated member includes the same or a different temperature regulating material.

A multi-component fiber in accordance with some embodiments of the invention may comprise from about 1 percent up to about 99 percent by weight of a first elongated member (or a first plurality of elongated members). Typically, a multi-component fiber according to an embodiment of the invention may comprise from about 10 percent to about 90 percent by weight of a first elongated member (or a first plurality of elongated members). For instance, an embodiment of a core/sheath fiber may comprise 90 percent by weight of a core member and 10 percent by weight of a sheath member. For this embodiment, the core member may comprise 60 percent by weight of a temperature regulating material, such that the core/sheath fiber comprises 54 percent by weight of the temperature regulating material. Another embodiment of the core/sheath fiber may comprise up to about 50 percent by weight of the core member, which in turn may comprise up to about 50 percent by weight of a temperature regulating material. Utilizing such weight percentages provides the core/sheath fiber with up to about 25 percent by weight of the temperature regulating material and provides effective thermal regulating and mechanical properties for the core/sheath fiber. It should be recognized that the percent by weight of an elongated member relative to a total weight of the multi-component fiber may be varied, for example, by adjusting a cross sectional area of the elongated member or by adjusting the extent to which the elongated member extends through the length of the multi-component fiber.

Multi-component fibers in accordance with various embodiments of the invention may be manufactured using a variety methods, such as, for example, using a melt spinning process or a solution spinning process (wet or dry). For either process, multi-component fibers may be formed by extruding materials through a plurality of orifices in a spinneret to form fibers that emerge from the orifices. As used herein, the term "spinneret" may refer to a portion of a fiber extrusion apparatus that delivers one or more polymeric materials and one or more temperature regulating materials through orifices for extrusion into an outside environment. A typical spinneret may comprise from 1 to 5000 orifices per meter of length of the spinneret. The spinneret may be implemented with holes drilled or etched through a plate or with any other structure capable of issuing desired fibers.

In a melt spinning process, one or more polymeric materials and one or more temperature regulating materials forming the multi-component fibers may be delivered to the orifices of the spinneret in a molten state. Prior to passing through the orifices, a temperature regulating material may be mixed with a first polymeric material to form a blend. As a result of mixing, the temperature regulating material may be dispersed within and at least partially enclosed by the first polymeric material. Portions of the temperature regulating material that are not enclosed by the first polymeric material may be enclosed by a second polymeric material upon emerging from the spinneret to reduce or prevent loss or leakage of the temperature regulating material from the resulting multi-component fibers. The blend and the second polymeric material may be combined and directed through each orifice in various configurations to form a first elongated member (or a first plurality of elongated members) and a second elongated member (or a second plurality of elongated members), respectively, thus forming a multi-component fiber. For example, the blend may be directed through the orifices to form core members of core/sheath fibers or island members of island-in-sea fibers, and the second polymeric material may be directed through the orifices to form sheath members of core/sheath fibers or sea members of island-in-sea fibers.

According to some embodiments of the invention, multi-component fibers may be formed using pellets comprising the first polymeric material and the temperature regulating material. The pellets may, for example, comprise a solidified melt mixture of the temperature regulating material, a low molecular weight polymer, and a high molecular weight polymer. According to other embodiments of the invention, the pellets may be formed from the first polymeric material, and the pellets may be impregnated or imbibed with a phase change material. The pellets may be melted to form a blend and processed along with the second polymeric material as discussed above to form multi-component fibers.

In a solution spinning process, one or more polymeric materials and one or more temperature regulating materials forming the multi-component fibers may be dissolved in a solvent prior to passing through the orifices of the spinneret. In a wet spinning process, the spinneret may be submerged in a chemical bath such that, upon exiting the spinneret, the materials precipitate from solution and form a solid fiber. In a dry spinning process, the materials may emerge from the spinneret in air and solidify due to the solvent (e.g., acetone) evaporating in air.

For either process, it should be recognized that the first polymeric material need not be used for certain applications. For instance, the temperature regulating material may comprise a polymeric phase change material having a desired transition temperature and providing adequate mechanical properties when incorporated in the multi-component fibers. Thus, the temperature regulating material and the second polymeric material may be combined and directed through each orifice in various configurations to form a first elongated member (or a first plurality of elongated members) and a second elongated member (or a second plurality of elongated members), respectively. For example, the temperature regulating material may be directed through the orifices to form core members of core/sheath fibers or island members of island-in-sea fibers, and the second polymeric material may be directed through the orifices to form sheath members of core/sheath fibers or sea members of island-in-sea fibers.

After emerging from the spinneret, multi-component fibers may be drawn or stretched utilizing a godet or an aspirator. For example, multi-component fibers emerging from the spinneret in a melt spinning process may form a vertically oriented curtain of downwardly moving fibers that are at least partially quenched before entering a long, slot-shaped air aspirator positioned below the spinneret. The aspirator may introduce a rapid, downwardly moving air stream produced by compressed air from one or more air aspirating jets. The air stream may create a drawing force on the fibers, causing them to be drawn between the spinneret and the air jet and attenuating the fibers. During this portion of the manufacturing process, the polymeric materials forming the multi-component fibers are typically solidifying.

Once formed, multi-component fibers may be further processed for numerous fiber applications known in the art. In particular, multi-component fibers may be subjected to, by way of example and not by limitation, woven, non-woven, knitting, or weaving processes to form various types of plaited, braided, twisted, felted, knitted, woven, or non-woven fabrics. For example, multi-component fibers may be wound on a bobbin or spun into a yarn and then utilized in various conventional knitting or weaving processes. As another example, multi-component fibers may be randomly laid on a forming surface (e.g., a moving conveyor screen belt such as a Fourdrinier wire) to form a continuous, non-woven web of fibers. According to an embodiment of the invention, multi-component fibers may be cut into short staple fibers prior to forming the web. One potential advantage of employing staple fibers is that a more isotropic non-woven web may be formed, since the staple fibers may be oriented in the web more randomly than longer or uncut fibers (e.g., continuous fibers). The web may then be bonded using any conventional method (e.g., a spunbond process) to form a stable, non-woven fabric for use in manufacturing a variety of textiles. An exemplary bonding method involves lifting the web from the moving screen belt and passing the web through two heated calender rolls. If desired, one of the rolls may be embossed to cause the web to be bonded in numerous spots. Air carded or spun-laid webs may also be formed from multi-component fibers according to some embodiments of the invention.

It should be recognized that fabrics may be formed from multi-component fibers comprising two or more different temperature regulating materials. According to some embodiments of the invention, such combination of temperature regulating materials may exhibit two or more distinct transition temperatures. For instance, a fabric for use in manufacturing a glove may be formed from multi-component fibers comprising phase change materials A and B. Phase change material A may have a melting point of about 5° C., and phase change material B may have a melting point of about 75° C. This combination of phase change materials in the multi-component fibers may provide the glove with enhanced thermal regulating properties in cold environments (e.g., outdoor use during winter conditions) as well as warm environments (e.g., when handling heated objects such as oven trays). In addition, fabrics may be formed from two or more types of multi-component fibers that differ in some fashion (e.g., formed with different configurations or comprising different temperature regulating materials). For example, a fabric may be formed from a certain percentage of core/sheath fibers comprising a first temperature regulating material and a remaining percentage of core/sheath fibers comprising a second temperature regulating material. This combination of core/sheath fibers may provide the fabric with enhanced thermal regulating properties in different environments (e.g., cold and warm).

Figure 5:
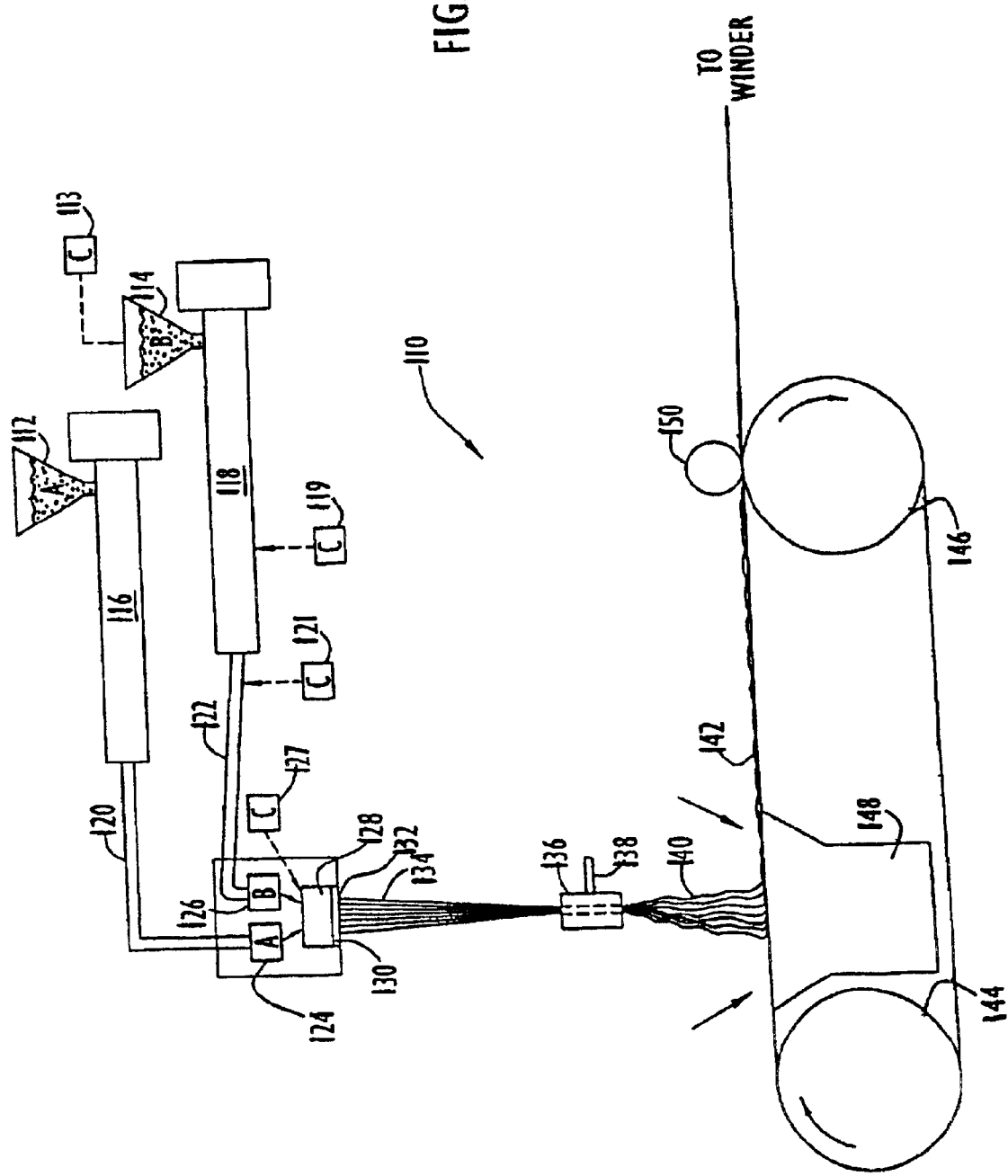
FIG. 5 illustrates an exemplary fiber extrusion apparatus for forming multi-component fibers in accordance with an embodiment of the invention.

Turning next to FIG. 5, an exemplary fiber extrusion apparatus 110 for forming multi-component fibers 134 in accordance with an embodiment of the invention is illustrated. The apparatus 110 may be used to form the multi-component fibers 134 via a melt spinning process. In addition, the apparatus 110 may be used to subject the formed multi-component fibers 134 to a spunbond process to produce a non-woven fabric having desired thermal regulating properties.

The apparatus 110 includes a spin pack 128 for extruding and forming the multi-component fibers 134. As used herein, the term "spin pack" may refer to an assembly for processing one or more polymeric materials and one or more temperature regulating materials to produce extruded fibers. According to some embodiments of the invention, a spin pack may include a filtration system, a distribution system, and a spinneret. Exemplary spin packs are described in Hills, U.S. Pat. No. 5,162,074, entitled "Method of Making Plural Component Fibers" and references cited therein, the disclosures of which are incorporated herein by reference in their entirety. In the present embodiment, the spin pack 128 provides a flow path for two or more molten polymeric materials, and the multi-component fibers 134 may emerge from spinneret 130 having one or more configurations (e.g., core-sheath or island-in-sea configurations).

As shown in FIG. 5, apparatus 110 also includes hoppers 112 and 114 that receive a polymeric material A and a polymeric material B, respectively. Polymeric materials A and B may be provided in the form of a liquid or solid (e.g., as pellets) and are respectively fed from hoppers 112 and 114 into screw extruders 116 and 118. If initially provided in solid form, polymeric materials A and B typically melt as they are conveyed towards heated pipes 120 and 122. A temperature regulating material C may be added to and mixed with polymeric material B at one or more locations along apparatus 110 to form a blend prior to encountering polymeric material A at the spinneret 130. FIG. 5 shows various exemplary locations for adding temperature regulating material C to polymeric material B in apparatus 110. For example, temperature regulating material C may be added at location 113 to the hopper 114, at location 119 to the screw extruder 118, or at location 127 to the spin pack 128. It should be recognized that temperature regulating material C may be added to polymeric material B to form a blend, and this blend may be provided in the form of a liquid or solid (e.g., as pellets) and then fed into the hopper 114. Alternatively or in conjunction, temperature regulating material C (or another temperature regulating material having somewhat different properties) may be added to and mixed with polymeric material A at one or more locations along apparatus 110 to form a blend. According to some embodiments of the invention, temperature regulating material C may comprise a polymeric phase change material that provides adequate mechanical properties when incorporated in the multi-component fibers 134. For such embodiments of the invention, polymeric material B may be omitted, and temperature regulating material C may be simply added at location 113 to the hopper 114 and combined with polymeric material A at the spinneret 130 to form the multi-component fibers 134.

In the embodiment of the invention shown in FIG. 5, mixing of temperature regulating material C with polymeric material B may be accomplished in either, or both, a static or dynamic fashion. Dynamic mixing may occur by any mechanical method that effectively agitates or mixes temperature regulating material C with polymeric material B to form the blend, such as, for example, by using the screw extruder 118. For example, when temperature regulating material C is added to the hopper 114 or to the screw extruder 118, dynamic mixing occurs, and a liquid stream of the blend is moved within the screw extruder 118 towards the heated pipe 122.

In contrast to dynamic mixing, static mixing typically need not utilize any mechanical agitating or mixing methods. According to some embodiments of the invention, static mixing may be effected by intersecting pathways of two or more traveling liquid streams of different materials a sufficient number of times to achieve desired mixing. An exemplary static mixer that may be used according to an embodiment of the invention is described in Haggard et al., U.S. Pat. No. 5,851,562, entitled "Instant Mixer Spin Pack", the disclosure of which is incorporated herein by reference in its entirety. Static mixing of temperature regulating material C with polymeric material B may occur within the spin pack 128 or at various other locations within the apparatus 110 prior to combining with polymeric material A at the spinneret 130. For example, temperature regulating material C may be added at location 121 and statically mixed with polymeric material B as it travels within the heated pipe 122. In particular, a first liquid stream of temperature regulating material C may be intersected with a second liquid stream of polymeric material B to form the desired blend in a resulting liquid stream. If desired, the resulting liquid stream may be further subjected to either, or both, static or dynamic mixing prior to combining with polymeric material A at the spinneret 130.

With reference to FIG. 5, liquid streams of polymeric material A and the blend may respectively flow through the heated pipes 120 and 122 to metering pumps 124 and 126, which feed the two liquid streams to the spin pack 128. The spin pack 128 has suitable internal components capable of forming the multi-component fibers 134 having a desired configuration (e.g., a core-sheath or island-in-sea configuration). In the apparatus 110 of FIG. 5, the liquid streams are combined in the spin pack 128 such that polymeric material A surrounds the blend. The spin pack 128 includes the spinneret 130 with orifices 132 that form the multi-component fibers 134 extruded therethrough. An array of the multi-component fibers 134 exit the spinneret 130 and are pulled downward and attenuated by an aspirator 136. The aspirator 136 is fed by compressed air or steam from pipe 138. The aspirator 136 may be, for example, of the gun type or of the slot type and, if desired, may extend across the full width of the fiber array, e.g., in the direction corresponding to the width of a web to be formed from the multi-component fibers 134.

It should be recognized that a plurality of separate blends may be formed, wherein each blend comprises one or more temperature regulating materials and one or more polymeric materials. The separate blends may differ from one another in some fashion. For instance, the separate blends may comprise different temperature regulating materials or different polymeric materials. Once formed, the separate blends may be combined with polymeric material A in the spin pack 128 such that polymeric material A surrounds the plurality of separate blends. The separate blends and polymeric material A may then be extruded from the spinneret 130 so as to form multi-component fibers having a desired configuration (e.g., an island-in-sea configuration). According to an embodiment of the invention, an outer member (e.g., a sea member) may be formed of polymeric material A and may surround a plurality of inner members (e.g., island members) formed of the plurality of separate blends.

With reference to FIG. 5, the aspirator 136 delivers attenuated multi-component fibers 140 onto a web-forming screen belt 142, which is supported and driven by rolls 144, 146, and 150. A suction box 148 may be connected to a fan (not shown in FIG. 5) to pull ambient air through the screen belt 142 to cause the attenuated multi-component fibers 140 to form a non-woven web on the screen belt 142. The resulting non-woven web can then be further processed to form textiles, apparel, or other products that are endowed with thermal regulating properties.

EXAMPLES

The following examples describe specific aspects of the invention to illustrate and provide a description of the invention for those of ordinary skill in the art. The examples should not be construed as limiting the invention, as the examples merely provide specific methodology useful in understanding and practicing the invention.

Example 1

About five pounds of a low molecular weight polyethylene homopolymer (AC-16 polyethylene, drop point 102° C., manufactured by Honeywell Specialty Chemical) was added to a wet flushing apparatus, and the homopolymer was slowly melted and mixed at about 110° to about 130° C. Once the homopolymer was melted, about eight pounds of a wet cake was slowly added to the molten homopolymer over about a 30 minute time period to form a first blend. The wet cake comprised water-wetted microcapsules containing a phase change material (micro PCM lot #M 45-22, 63.2 percent by weight of microcapsules and phase change material, manufactured by Microtek Laboratories, Inc.).

Water was flashed off as the microcapsules containing the phase change material was added to and dispersed in the molten homopolymer. Mixing continued until less than about 0.15 percent by weight of the water remained (as measured using Karl-Fischer titration). The resulting first blend was then cooled and chopped to form a chopped material for further processing.

A dry blend was then formed by dry blending about thirty pounds of the chopped material with about seventy pounds of a fiber-grade polypropylene thermoplastic polymer (Polypropylene homopolymer 6852, manufactured by BP Amoco Polymers).

The resulting dry blend was then extruded using a 2½ inch single screw extruder with all zones set at about 230° C., with a screw speed of about 70 rpm, with 150 mesh filter screens, and with a nitrogen purge. In this manner, pellets were formed. The pellets were then dried overnight in a desiccant bed polymer pellet drying system at 105° C. and at −40° C. dewpoint. These pellets provided 23.1 J/g of thermal energy storage capacity (i.e., latent heat) as measured by DSC (Differential Scanning Calorimeter) measurements.

Multi-component fibers (here, bi-component fibers) were then melt spun using a bi-component fiber spin pack at temperatures between 230° and 245° C. Spin packs of this general type are described in Hills, U.S. Pat. No. 5,162,074, entitled "Method of Making Plural Component Fibers". The pellets were used to from core members, and polypropylene or nylon was used to form sheath members.

Multi-component fibers formed with various core/sheath ratios and polymeric materials were produced. With reference to FIG. 6, a number of properties and manufacturing parameters of six core/sheath fibers that were produced are set forth. These fibers all incorporate a phase change material and microcapsules that contain the phase change material ("mPCM"), which makes up about 15 percent by weight of each fiber's core member and from about 7.5 percent to about 11.25 percent by weight of each fiber's total weight. Samples 1, 2 and 3 have a sheath member comprising polypropylene ("PP"), which is a polypropylene homopolymer from BP Amoco Polymers. Samples 4, 5 and 6 have a sheath member comprising Nylon 6, which is produced under the name Ultramid B from BASF Corp.

Example 2

Various polyethylene-co-vinyl acetate ("EVA") pellets were imbibed with K19 paraffin wax (melt point 29° C., 150 J/g latent heat, manufactured by American Refining Group, Bradford, Pa.) by soaking and heating to swell the pellets. In particular, Elvax 350 (19 melt index, 25 percent by weight of vinyl acetate, manufactured by DuPont Inc.) and Elvax 450 (8 melt index, 18 percent by weight of vinyl acetate, manufactured by DuPont Inc.) pellets were heated for various times and temperatures. The pellets were filtered away from the remainder of the paraffin wax in a drain tank, and the amount of paraffin wax imbibed into the pellets was calculated from initial and final pellet weights (i.e., as percent weight increase relative to initial pellet weights). Table 3 sets forth the results obtained under various conditions.

TABLE 3

| EVA Type | Imbibe Time (hr) | Imbibe Temp. (° C.) | % wax imbibed | Comments |
| --- | --- | --- | --- | --- |
| Elvax 450 | 1.0 | 50 | 16 | Sticky in drain tank. Drained more the next day. |
| Elvax 450 | 1.0 | 40 | 16 | Sticky in drain tank. Drained more the next day. |
| Elvax 450 | 1.0 | 80 |  | Melted |
| Elvax 450 | 1.0 | 55 | 16 | Sticky in drain tank. Drained more the next day. |
| Elvax 450 | 3.0 | 55 | 32 | Sticky in drain tank. Drained more the next day. |
| Elvax 450 | 2.0 | 55 | 26 | Sticky in drain tank. Drained more the next day. |
| Elvax 450 | 1.0 | 60 | 43 | Sticky in drain tank. Drained more the next day. |
| Elvax 450 | 2.0 | 60 | 43 | Sticky in drain tank. Drained more the next day. |
| Elvax 450 | 5.0 | 60 | 44 | Sticky in drain tank. Drained more the next day. |
| Elvax 450 | 3.0 | 60 | 39 | Sticky in drain tank. Drained more the next day. |
| Elvax 350 | 2.0 | 40 | 31 | Dry in the drain tank. Stayed dry. Stuck lightly |
| Elvax 350 | 3.5 | 40 | 38 | Dry in the drain tank. Stayed dry. Stuck lightly |
| Elvax 350 | 2.5 | 45 | 48 | Dry in the drain tank. Stayed dry. Stuck lightly |
| Elvax 350 | 2.0 | 40 | 20 | Dry in the drain tank. Stayed dry. Stuck lightly |
| Elvax 350 | 2.0 | 40 | 20 | Dry in the drain tank. Stayed dry. Stuck lightly |

Core/sheath fibers were then produced with a standard Hills, Inc. bi-component fiber spin pack using some of the pellets described above to form core members. In particular, core members were formed using either 26 percent wax imbibed Elvax 450 pellets or 31 percent wax imbibed Elvax 350 pellets. Sheath members were formed using either polyethylene terephthalate (Eastman F61HC, manufactured by Eastman Chemical, Inc., Kingsport, Tenn.) ("PET") or polytrimethylene terephthalate (Corterra 509210, manufactured by Shell Chemical Corp., Houston, Tex.) ("PTT").

DSC measurements of the core/sheath fibers were made using a Perkin Elmer Pyris 1 instrument. Cooling was accomplished using a FTS Systems Intercooler 1, and data analysis was performed using a Perkin Elmer Pyris Thermal Analysis System and Software for Windows, version 3.72. Test samples were prepared in Perkin Elmer hermetically sealed aluminum sample pans, and testing was performed while the test samples were continuously subjected to $N_2$ flow.

Test conditions comprised: 1) cooling the test samples to about −10° C.; 2) isothermal hold for about 1 minute at −10° C.; 3) heating from −10° C. to about 50° C. at a rate of about 5° C. per minute; 4) isothermal hold for about 1 minute at 50° C.; and then 5) cooling from 50° C. to about −10° C. at a rate of about 5° C. per minute. Results were calculated using automatic machine integration of the measured crystallization exotherm peak of the paraffin wax. Table 4 sets forth various properties of the core/sheath fibers.

TABLE 4

| Sheath Member | Core Member | Latent Heat (J/g) | Denier/filament | Tenacity (g/d) | Elongation (%) |
| --- | --- | --- | --- | --- | --- |
| PTT | 26% wax imbibed Elvax 450 | 12.3 | 4.4 | 2.2 | 35 |
| PET | 31% wax imbibed Elvax 350 | 6.9 | 3.7 | 2.8 | 30 |
| PET | 31% wax imbibed Elvax 350 | 8.4 | 34.5 | 1.43 | 57 |

Each of the patent applications, patents, publications, and other published documents mentioned or referred to in this specification is herein incorporated by reference in its entirety, to the same extent as if each individual patent application, patent, publication, and other published document was specifically and individually indicated to be incorporated by reference.

While the present invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, process step or steps, to the objective, spirit and scope of the present invention. All such modifications are intended to be within the scope of the claims appended hereto. In particular, while the methods disclosed herein have been described with reference to particular steps performed in a particular order, it will be understood that these steps may be combined, sub-divided, or re-ordered to form an equivalent method without departing from the teachings of the present invention. Accordingly, unless specifically indicated herein, the order and grouping of the steps is not a limitation of the present invention.

What is claimed is:

1. A multi-component fiber having enhanced reversible thermal properties, comprising:
    a fiber body formed from a plurality of elongated members, at least one of the elongated members comprising a polymeric phase change material having a transition temperature in the range of 22° C. to 40° C., wherein the polymeric phase change material provides thermal regulation based on at least one of melting and crystallization of the polymeric chase change material at the transition temperature.

2. The multi-component fiber of claim 1, wherein the transition temperature of the polymeric phase change material is in the range of 22° C. to 28° C.

3. The multi-component fiber of claim 1, wherein the polymeric phase change material is selected from the group consisting of polyethylene, polypropylene, polypropylene glycol, polytetramethylene glycol, polypropylene malonate, polyneopentyl glycol sebacate, polypentane glutarate, polyvinyl myristate, polyvinyl stearate, polyvinyl laurate, polyhexadecyl methacrylate, polyoctadecyl methacrylate, polyethylene glycol, polyethylene oxide, and polyesters.

4. The multi-component fiber of claim 1, wherein the at least one of the elongated members comprises from 10 percent to 90 percent of a total weight of the multi-component fiber.

5. The multi-component fiber of claim 1, wherein the at least one of the elongated members comprises from 5 percent to 70 percent by weight of the polymeric phase change material.

6. The multi-component fiber of claim 1, wherein the elongated members are arranged in an island-in-sea configuration, a segmented-pie configuration, a core-sheath configuration, a side-by-side configuration, or a striped configuration.

7. The multi-component fiber of claim 1, wherein a cross sectional shape of the fiber body is circular, multi-lobal, octagonal, oval, pentagonal, rectangular, square-shaped, trapezoidal, or triangular.

8. The multi-component fiber of claim 1, wherein the fiber body is between 0.1 and 1000 denier.

9. The multi-component fiber of claim 1, further comprising an additive dispersed within at least one of the elongated members, wherein the additive is selected from the group consisting of water, surfactants, dispersants, antifoam agents, antioxidants, thermal stabilizers, light stabilizers, UV stabilizers, microwave absorbing additives, reinforcing fibers, conductive fibers, conductive particles, lubricants, process aids, fire retardants, anti-blocking additives, anti-fogging additives, anti-static additives, antimicrobials, crosslinkers, controlled degradation agents, colorants, pigments, dyes, fluorescent whitening agents, optical brighteners, fillers, coupling agents, reinforcement agents, crystallization agents, nucleation agents, and mixtures thereof.

10. A multi-component fiber having enhanced reversible thermal properties, comprising:
    a first elongated member comprising a first polymeric material and a first temperature regulating material dispersed within the first polymeric material; and
    a second elongated member comprising a second polymeric material, wherein the second temperature regulating material dispersed with the second polymeric material, wherein the second elongated member is joined with the first elongated member.

11. The multi-component fiber of claim 10, wherein the temperature regulating material comprises a phase change material.

12. The multi-component fiber of claim 11, wherein the phase change material is a hydrocarbon or a mixture of hydrocarbons.

13. The multi-component fiber of claim 11, wherein the temperature regulating material further comprises a plurality of microcapsules that contain the phase change material.

14. The multi-component fiber of claim 13, wherein the first polymeric material has an affinity for the microcapsules to facilitate dispersing the microcapsules within the first polymeric material.

15. The multi-component fiber of claim 11, wherein the phase change material has a transition temperature in the range of 22° C. to 40° C.

16. The multi-component fiber of claim 10, wherein the first temperature regulating material and the second temperature regulating material are different.

17. The multi-component fiber of claim 10, wherein the first polymeric material and the second polymeric material are independently selected from the group consisting of polyamides, polyamines, polyimides, polyacrylics, polycarbonates, polydienes, polyepoxides, polyesters, polyethers, polyfluorocarbons, formaldehyde polymers, natural polymers, polyolefins, polyphenylenes, silicon containing polymers, polyurethanes, polyvinyls, polyacetals, polyarylates, copolymers, and mixtures thereof.

18. The multi-component fiber of claim 10, wherein the first polymeric material comprises polyethylene-co-vinyl acetate having between 5 percent and 90 percent by weight of vinyl acetate.

19. The multi-component fiber of claim 10, wherein the first elongated member is surrounded by the second elongated member.

20. The multi-component fiber of claim 19, wherein the first elongated member is positioned within and completely surrounded by the second elongated member.

21. The multi-component fiber of claim 10, wherein the first elongated member comprises from 10 percent to 90 percent of a total weight of the multi-component fiber.

22. The multi-component fiber of claim 10, wherein the multi-component fiber is between 0.1 and 1000 denier.

23. The multi-component fiber of claim 10, further comprising an additive dispersed within at least one of the first polymeric material and the second polymeric material, wherein the additive is selected from the group consisting of water, surfactants, dispersants, anti-foam agents, antioxidants, thermal stabilizers, light stabilizers, UV stabilizers, microwave absorbing additives, reinforcing fibers, conductive fibers, conductive particles, lubricants, process aids, fire retardants, anti-blocking additives, anti-fogging additives, anti-static additives, anti-microbials, crosslinkers, controlled degradation agents, colorants, pigments, dyes, fluorescent whitening agents, optical brighteners, fillers, coupling agents, reinforcement agents, crystallization agents, nucleation agents, and mixtures thereof.

24. A multi-component fiber having enhanced reversible thermal properties, comprising:
a core member comprising a first temperature regulating material dispersed therein, wherein the first temperature regulating material comprises a phase change material having a transition temperature in the range of −50° C. to 125° C. and a plurality of microcapsules that contain the phase change material; and
a sheath member surrounding the core member, wherein the sheath member comprises a second temperature regulating material dispersed therein.

25. The multi-component fiber of claim 24, wherein the transition temperature of the phase change material is in the range of 22° C. to 40° C.

26. The multi-component fiber of claim 24, wherein the phase change material is selected from the group consisting of hydrocarbons, hydrated salts, waxes, oils, water, fatty acids, fatty acid esters, dibasic acids, dibasic esters, 1-halides, primary alcohols, aromatic compounds, clathrates, semi-clathrates, gas clathrates, stearic anhydride, ethylene carbonate, polyhydric alcohols, polymers, metals, and mixtures thereof.

27. The multi-component fiber of claim 24, wherein the phase change material is a paraffinic hydrocarbon having from 13 to 28 carbon atoms.

28. The multi-component fiber of claim 24, wherein the core member further comprises a first polymeric material, wherein the first temperature regulating material is dispersed within the first polymeric material, wherein the sheath member further comprises a second polymeric material, and wherein the second temperature regulating material is dispersed within the second polymeric material.

29. The multi-component fiber of claim 28, wherein the core member comprises from 10 percent to 30 percent by weight of the first temperature regulating material.

30. The multi-component fiber of claim 28, wherein the first polymeric material has an affinity for the microcapsules, and wherein the second polymeric material encloses the phase change material within the core member and provides a desired physical property to the multi-component fiber.

31. The multi-component fiber of claim 28, wherein the phase change material is a first phase change material, wherein the plurality of microcapsules is a first plurality of microcapsules, and wherein the second temperature regulating material comprises a second phase change material having a transition temperature in the range of −5° C. to 125° C. and a second plurality of microcapsules that contain the second phase change material.

32. The multi-component fiber of claim 31, wherein the first phase change material and the second phase change material are different.

33. The multi-component fiber of claim 28, wherein the first polymeric material and the second polymeric material are independently selected from the group consisting of polyamides, polyamines, polyimides, polyacrylics, polycarbonates, polydienes, polyepoxides, polyesters, polyethers, polyfluorocarbons, formaldehyde polymers, natural polymers, polyolefins, polyphenylenes, silicon containing polymers, polyurethanes, polyvinyls, polyacetals, polyarylates, copolymers, and mixtures thereof.

34. The multi-component fiber of claim 24, wherein the core member is positioned within and completely surrounded by the sheath member.

35. The multi-component fiber of claim 24, wherein the core member is concentrically positioned within the sheath member.

36. The multi-component fiber of claim 24, wherein the core member is eccentrically positioned within the sheath member.

37. The multi-component fiber of claim 24, wherein a cross sectional shape of the core member is circular, multi-lobal, octagonal, oval, pentagonal, rectangular, square-shaped, trapezoidal, triangular, or wedge-shaped.

38. The multi-component fiber of claim 24, wherein the multi-component fiber is between 0.1 and 1000 denier.

39. The multi-component fiber of claim 24, further comprising an additive dispersed within at least one of the core member and the sheath member, wherein the additive is selected from the group consisting of water, surfactants, dispersants, anti-foam agents, antioxidants, thermal stabilizers, light stabilizers, UV stabilizers, microwave absorbing additives, reinforcing fibers, conductive fibers, conductive particles, lubricants, process aids, fire retardants, anti-blocking additives, anti-fogging additives, anti-static additives, anti-microbials, crosslinkers, controlled degradation agents, colorants, pigments, dyes, fluorescent whitening agents, optical brighteners, fillers, coupling agents, reinforcement agents, crystallization agents, nucleation agents, and mixtures thereof.

40. A fiber having enhanced reversible thermal properties, comprising:
at least one inner member extending through substantially the length of the fiber and comprising a blend of a first polymeric material and a non-encapsulated phase change material having a transition temperature in the range of 22° C. to 40° C., wherein the non-encapsulated phase change material provides thermal regulation based on at least one of absorption and release of a latent heat at the transition temperature, and wherein the non-encapsulated phase change material is selected from the group consisting of solid/solid phase change materials and polymeric phase change materials; and
an outer member surrounding the inner member and forming the exterior of the fiber, wherein the outer member comprises a second polymeric material.

41. The fiber of claim 40, wherein the first polymeric material and the second polymeric material are independently selected from the group consisting of polyolefins, polyamides, polyesters, elastomeric polymers, and mixtures thereof.

42. The fiber of claim 41, wherein the first polymeric material and the second polymeric material are polyolefins independently selected from the group consisting of polyethylene, polypropylene, and mixtures thereof.

43. The fiber of claim 40, wherein the inner member comprises from 10 percent to 90 percent of a total weight of the fiber.

44. The fiber of claim 40, wherein the transition temperature of the non-encapsulated phase change material is in the range of 22° C. to 28° C.

45. The fiber of claim 40, wherein the non-encapsulated phase change material is selected from the group consisting of polyethylene, polypropylene, polypropylene glycol, polytetramethylene glycol, polypropylene malonate, polyneopentyl glycol sebacate, polypentane glutarate, polyvinyl myristate, polyvinyl stearate, polyvinyl laurate, polyhexadecyl methacrylate, polyoctadecyl methacrylate, polyethylene oxides, polyethylene glycols, polyesters, and mixtures thereof.

46. The fiber of claim 40, wherein the non-encapsulated phase change material is a polyhydric alcohol.

47. The fiber of claim 40, wherein the inner member comprises at least two non-encapsulated phase change materials.

48. The fiber of claim 40, wherein the inner member comprises up to 50 percent by weight of the non-encapsulated phase change material.

49. The fiber of claim 40, wherein the inner member comprises up to 25 percent by weight of the non-encapsulated phase change material.

50. The fiber of claim 40, wherein portions of the non-encapsulated phase change material are enclosed by the first polymeric material.

51. The fiber of claim 40, wherein the inner member is a single inner member defining a core within the fiber.

52. The fiber of claim 40, wherein the fiber comprises a plurality of inner members separated from each other and surrounded by the outer member.

53. The fiber of claim 40, wherein the fiber is a continuous fiber or a staple fiber.

54. A core/sheath fiber comprising:
a core member positioned within and extending through substantially the length of the fiber, wherein the core member comprises a blend of a first polymeric material and a non-encapsulated phase change material, wherein the first polymeric material has a partial affinity for the non-encapsulated phase change material, such that the non-encapsulated phase change material forms a plurality of domains dispersed within the first polymeric material; and
a sheath member forming the exterior of the fiber and surrounding the core member, wherein the sheath member comprises a second polymeric material.

55. The core/sheath fiber of claim 54, wherein the first polymeric material and the second polymeric material are independently selected from the group consisting of polyolefins, polyamides, polyesters, elastomeric polymers, and mixtures thereof.

56. The core/sheath fiber of claim 55, wherein the first polymeric material and the second polymeric material are polyolefins independently selected from the group consisting of polyethylene, polypropylene, and mixtures thereof.

57. The core/sheath fiber of claim 54, wherein the non-encapsulated phase change material is selected from the group consisting of $C_{10}$–$C_{44}$ paraffinic hydrocarbons, polyethylene oxides, polyethylene glycols, and mixtures thereof.

58. The core/sheath fiber of claim 54, wherein the non-encapsulated phase change material has a transition temperature in the range of 22° C. to 40° C.

59. The core/sheath fiber of claim 54, wherein the core member comprises a blend of the first polymeric material and at least two different non-encapsulated phase change materials.

60. An island-in-sea fiber comprising:
a plurality of island members positioned within and extending through substantially the length of the fiber, wherein each of the island members is separated from one another, and at least one of the island members comprises a blend of an island polymeric material and at least two different phase change materials; and
a sea member forming the exterior of the fiber and surrounding each of the island members, wherein the sea member comprises a sea polymeric material.

61. The island-in-sea fiber of claim 60, wherein the island polymeric material and the sea polymeric material are independently selected from the group consisting of polyolefins, polyamides, polyesters, elastomeric polymers, and mixtures thereof.

62. The island-in-sea fiber of claim 61, wherein the island polymeric material and the sea polymeric material are polyolefins independently selected from the group consisting of polyethylene, polypropylene, and mixtures thereof.

63. The island-in-sea fiber of claim 60, wherein the phase change materials are selected from the group consisting of $C_{10}$–$C_{44}$ paraffinic hydrocarbons, polyethylene, polypropylene, polypropylene glycol, polytetramethylene glycol, polypropylene malonate, polyneopentyl glycol sebacate, polypentane glutarate, polyvinyl myristate, polyvinyl stearate, polyvinyl laurate, polyhexadecyl methacrylate, polyoctadecyl methacrylate, polyethylene oxides, polyethylene glycols, polyesters, and mixtures thereof.

64. The island-in-sea fiber of claim 60, wherein at least one of the phase change materials is a solid/solid phase change material.

65. The island-in-sea fiber of claim 60, wherein at least one of the phase change materials has a transition temperature in the range of 22° C. to 40° C.

66. The island-in-sea fiber of claim 60, wherein at least two island members comprise different phase change materials.

67. The island-in-sea fiber of claim 60, wherein at least two island members comprise different island polymeric materials.

* * * * *